(12) United States Patent
Griglione et al.

(10) Patent No.: US 7,132,297 B2
(45) Date of Patent: Nov. 7, 2006

(54) MULTI-LAYER INDUCTOR FORMED IN A SEMICONDUCTOR SUBSTRATE AND HAVING A CORE OF FERROMAGNETIC MATERIAL

(75) Inventors: Michelle D. Griglione, Orlando, FL (US); Paul Arthur Layman, Orlando, FL (US); Mohamed Laradji, St. Cloud, FL (US); J. Ross Thomson, Clermont, FL (US); Samir Chaudhry, Westin, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/513,121

(22) PCT Filed: May 7, 2003

(86) PCT No.: PCT/US03/14475

§ 371 (c)(1),
(2), (4) Date: Oct. 27, 2004

(87) PCT Pub. No.: WO03/096394

PCT Pub. Date: Nov. 20, 2003

(65) Prior Publication Data

US 2005/0170554 A1 Aug. 4, 2005

Related U.S. Application Data

(60) Provisional application No. 60/378,476, filed on May 7, 2002.

(51) Int. Cl.
*H01L 21/00* (2006.01)
*H01L 21/82* (2006.01)
*H01L 21/20* (2006.01)

(52) U.S. Cl. .................... 438/3; 438/81; 438/128; 438/381; 257/531; 257/534; 257/E21.575

(58) Field of Classification Search ............. 438/381, 438/128, 81, 3; 257/534, 531
See application file for complete search history.

(56) References Cited

U.S. PATENT DOCUMENTS

| 5,227,659 | A | 7/1993 | Hubbard |
| 5,576,680 | A * | 11/1996 | Ling .................... 336/200 |
| 6,015,742 | A | 1/2000 | Ju |
| 6,083,802 | A | 7/2000 | Wen et al. |
| 6,166,422 | A | 12/2000 | Qian et al. |
| 6,255,714 | B1 | 7/2001 | Kossives et al. |
| 6,303,971 | B1 * | 10/2001 | Rhee .................... 257/531 |
| 6,489,041 | B1 | 12/2002 | Tamura et al. |

FOREIGN PATENT DOCUMENTS

WO WO 00/17915 * 3/2000

OTHER PUBLICATIONS

Niknejad, Ali M., et al; "Design, Simulation and Applications of Inductors and Transformers for Si RF ICs"; Kluwer Academic Publishers; 2000; pp. 22-31.
Prabhakaran, K.; "Nano-interface Engineering of Co/Ge/Si Systems: Metal Incorporation into GE Quantum Dots and SiO2/Si Structures"; Applied Surface Science 159-160; 2000; pp. 492-497.

* cited by examiner

*Primary Examiner*—Michael Lebentritt
*Assistant Examiner*—Mohsen Ahmadi

(57) ABSTRACT

A thin-film multilayer high-Q inductor having a ferromagnetic core and spanning at least three metal layers is formed by forming a plurality of parallel first metal runners on the semiconductor substrate. A plurality of first and second vertical conductive vias are formed in electrical connection with each end of the plurality of metal runners. A plurality of third and fourth conductive vias are formed over the plurality of first and second conductive vias and a plurality of second metal runners are formed interconnecting the plurality of third and fourth conductive vias. The first metal runners and second metal runners are oriented such that one end of a first metal runner is connected to an overlying end of a second metal runner by way of the first and third vertical conductive vias. The other end of the second metal runner is connected to the next metal one runner by way of the second and fourth vertical conductive vias., forming a continuously conductive structure having a generally helical shape. An inductor core is formed by first forming a silicon layer between each one of the plurality of first metal runners. A germanium layer is formed thereover and the structure is annealed, causing formation of quantum dots of germanium. A cobalt layer is then formed over the quantum dots and another anneal process drives the cobalt into the quantum dots, where it is captured to form the ferromagnetic core.

48 Claims, 37 Drawing Sheets

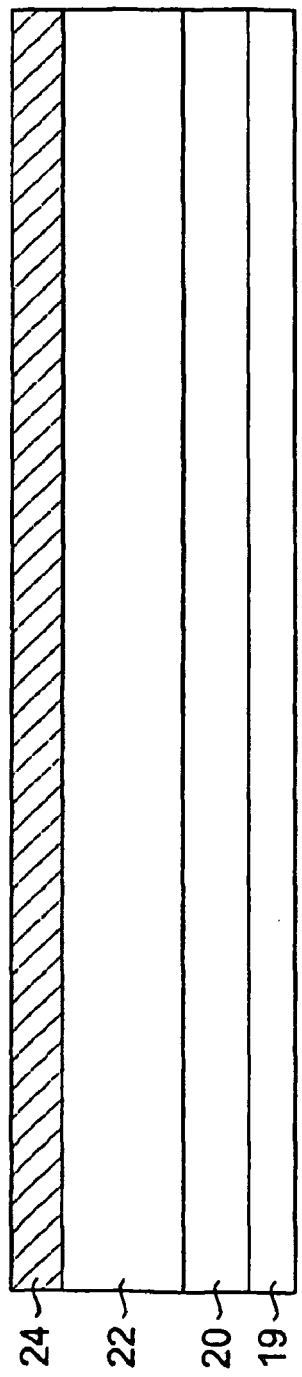
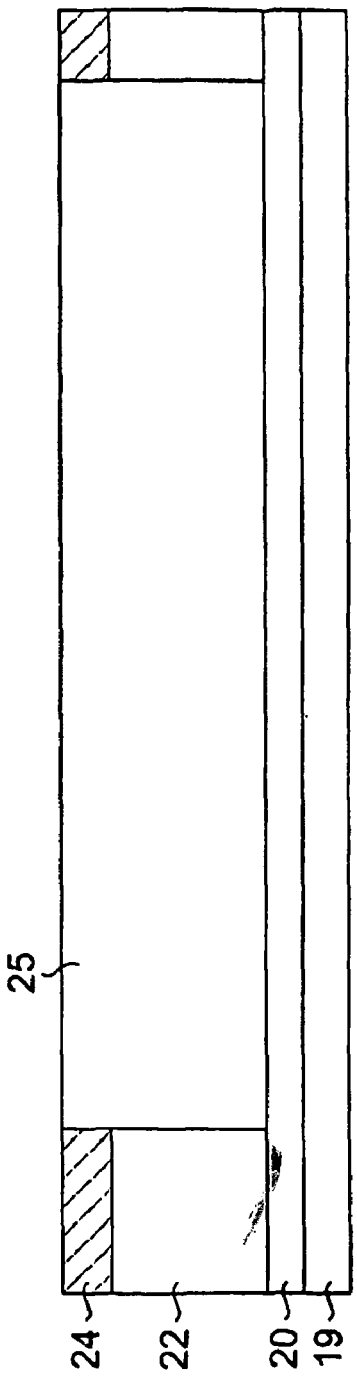

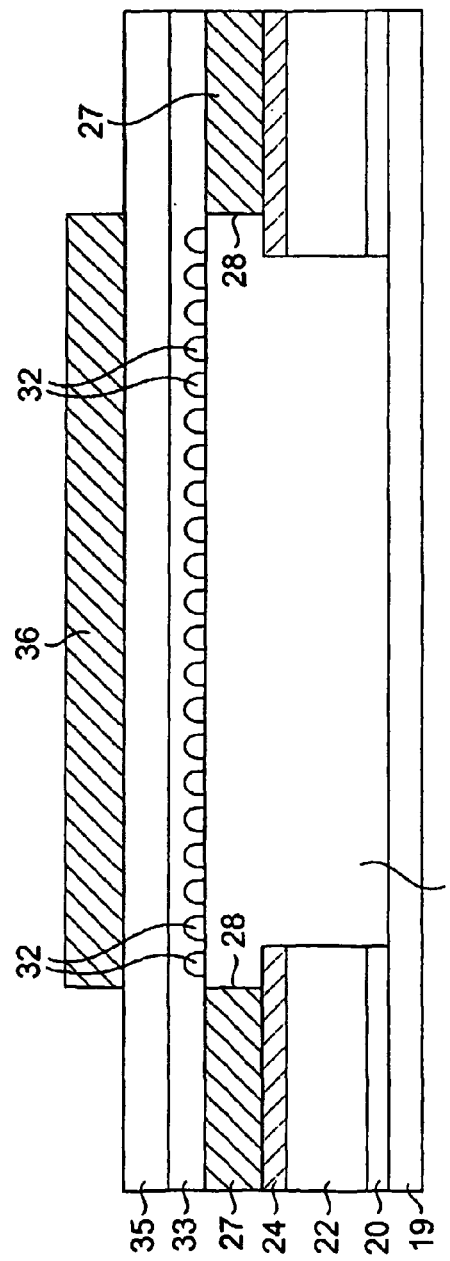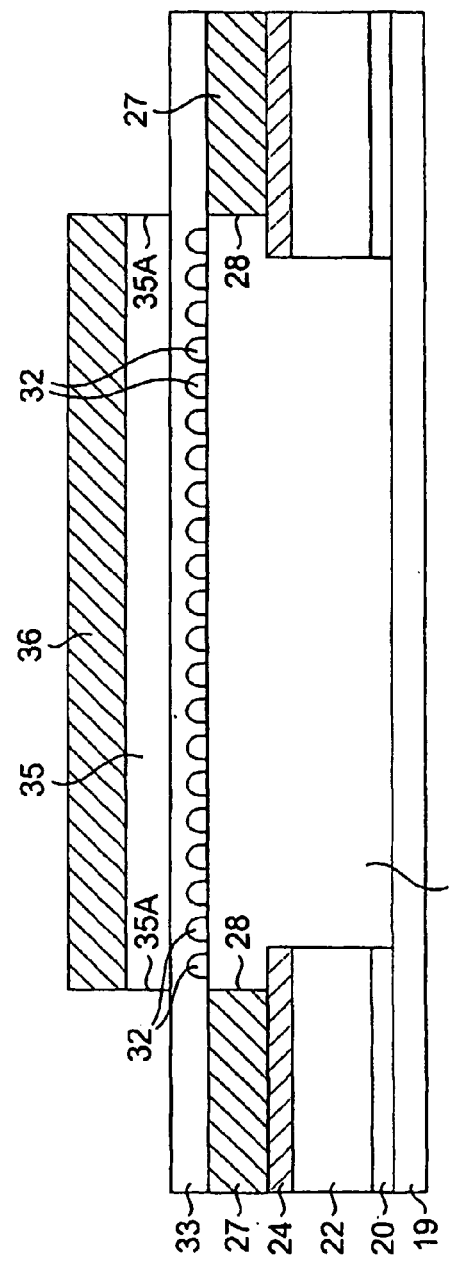

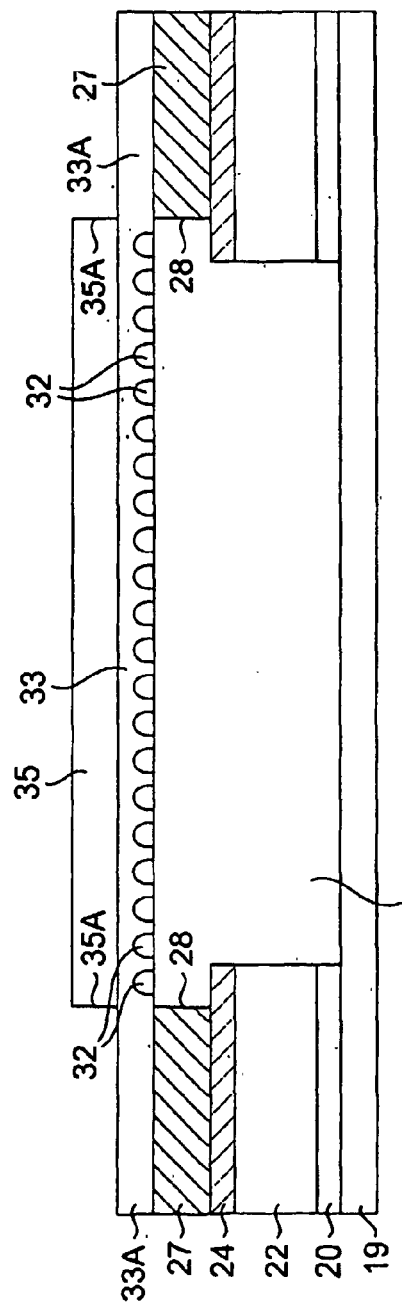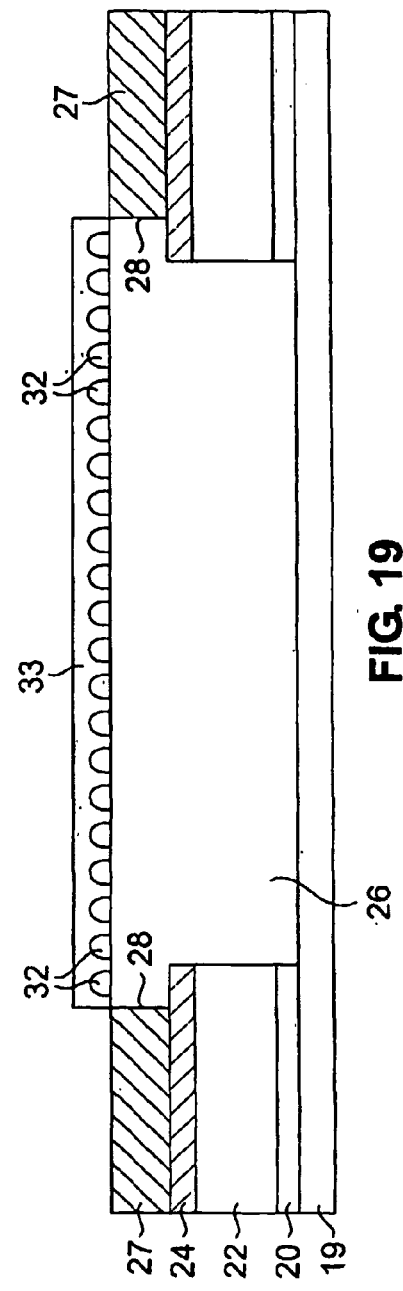
FIG. 18
FIG. 19

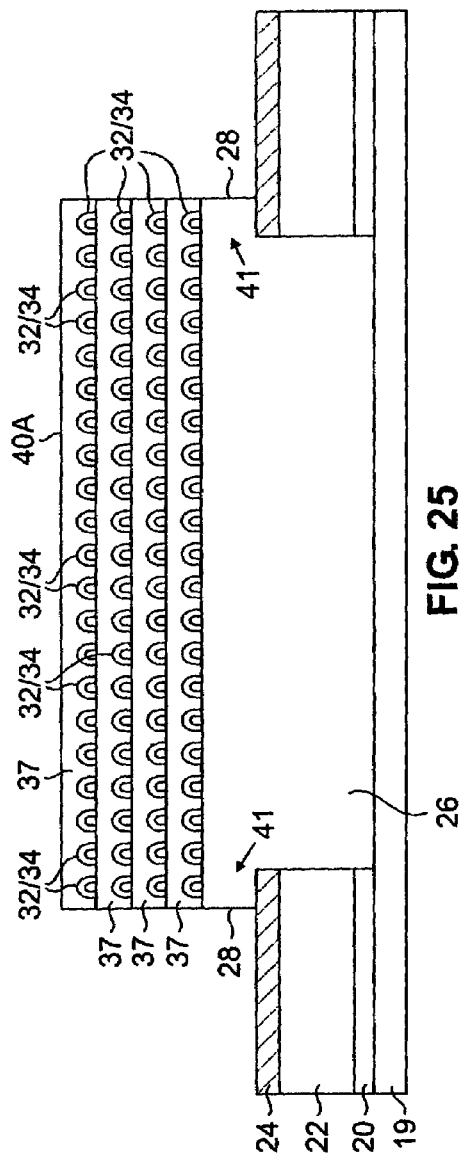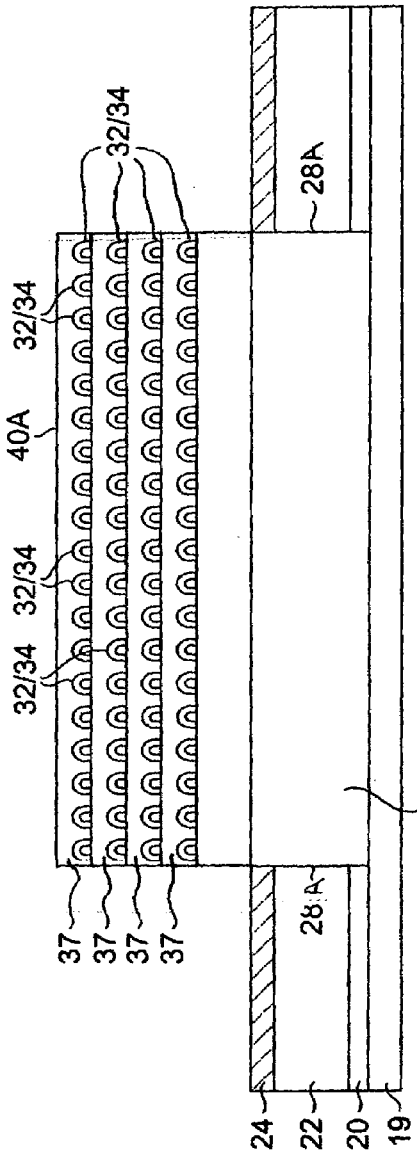

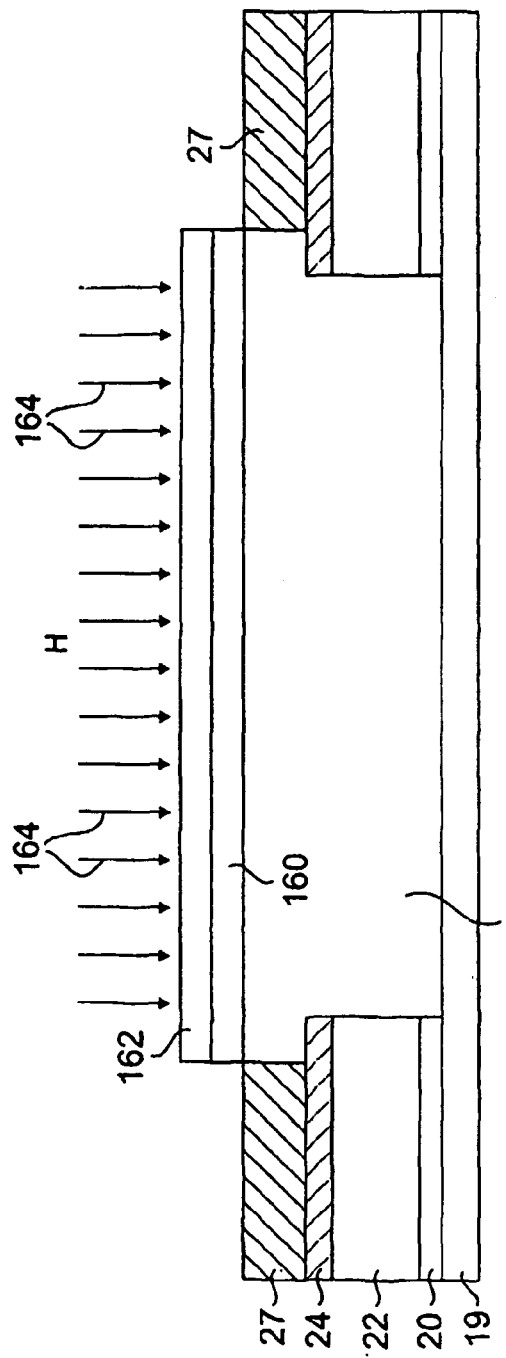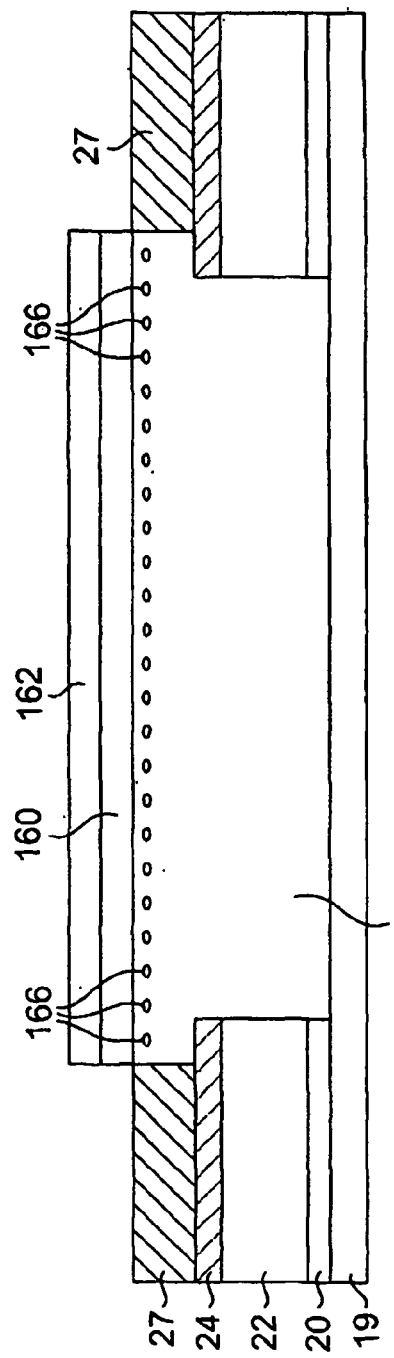

MULTI-LAYER INDUCTOR FORMED IN A SEMICONDUCTOR SUBSTRATE AND HAVING A CORE OF FERROMAGNETIC MATERIAL

This patent application claims priority to the provisional patent application filed on May 7, 2002, and assigned Ser. No. 60/378,476.

FIELD OF THE INVENTION

This invention relates generally to inductors, and more specifically, to inductors having a core of ferromagnetic nano-crystals.

BACKGROUND OF THE INVENTION

The current revolution in wireless communications and the need for smaller wireless communications devices have spawned significant efforts directed to the optimization and miniaturization of radio communications electronic devices. Passive components (such as inductors, capacitors and transformers), play a necessary role in the device's operation and thus efforts are directed toward reducing the size and improving the performance and fabrication processes for such components.

Discrete inductors, which play an integral role in the performance of these communications devices, are electromagnetic components comprising a plurality of windings typically enclosing a core constructed of either magnetic material or an insulator. The inductance of an inductor is a measure of the inductor's opposition to changes in the existing current. Use of a magnetic core yields higher inductance values than cores comprised of an insulator, such as air. Typical cores are formed of ferromagnetic material (e.g., iron, cobalt, nickel). These materials comprise a plurality of magnetic domains, and the application of a magnetic field to the core material causes domain alignment and a resulting increase in the material permeability, which in turn increases the inductance. The inductance is also a function of the number of coil turns (specifically, the inductance is proportional to the square of the number of turns), the core size and the core material. Conventional inductors are formed as a helix (also referred to as a solenoidal shape) or a torroid.

With the continual allocation of operational communications frequencies into higher frequency bands, inductor losses increase due to increased eddy current and skin effect losses. To avoid these losses at relatively low operational frequencies, the inductive effect can be simulated by employing certain active devices. But simulated inductors are more difficult to realize at higher frequencies, have a finite dynamic range and inject additional unwanted noise into the operating circuits.

The Q (or quality factor) is an important inductor figure of merit. The Q is a function of the ratio of inductive reactance to inductive resistance, and indicates the sharpness of the inductor's resonance. High Q inductors present a narrow resonant peak when the inductor current is graphed as a function of the input signal frequency, with the peak representing the inductor resonant frequency. High Q inductors are especially important for use in frequency-dependent circuits operating within narrow signal bandwidths. Because the Q value is an inverse function of inductor resistance, it is especially important to minimize the resistance to increase the Q.

Most personal communications devices incorporate integrated circuits fabricated using semiconductor technologies, such as silicon or gallium-arsenide. In the past, integrated planar inductors (including torroidal or spiral shapes) have been employed to achieve compatibility with the silicon-based integrated circuit fabrication processes. However, these planar inductors tend to suffer from high losses and low Q factors at the operational frequencies of the communications devices. These losses and low Q factors are generally attributable to dielectric losses caused by parasitic capacitances and resistive losses due to the use of thin and relatively high resistivity conductors. Also, the magnetic field lines generated during operation of a planar inductor are perpendicular to the major surface of the semiconductor substrate, along which the active devices are formed. These are closed-loop magnetic field lines that enter the material above, laterally adjacent and below the inductor. Field penetration through dielectric materials of the integrated circuit increases the inductive losses thereby lowering the inductor's Q factor. Also, if the inductor is not sufficiently spaced apart from active circuit elements of the integrated circuit, the magnetic fields can induce currents in and affect operation of the active elements.

As integrated circuit active devices grow smaller and operate at higher speeds, the interconnect system can disadvantageously add processing delays to the device signals. In this regard, as the circuit functions demand a greater number of interconnects and as the interconnect cross-section shrinks, conventional interconnect metallization materials, e.g., aluminum, severely limit circuit speeds. Further, the relatively small contact resistance between the aluminum and silicon can be a significant contributor to the total circuit resistance, especially as the number of circuit components and interconnects increases. Finally, as line widths continue to shrink, it becomes increasingly difficult to deposit aluminum within high aspect ratio vias and plugs.

Given theses disadvantages, copper is becoming the material of choice for metallization. It is a better conductor than aluminum (with a resistance of 1.7 micro-ohm cm compared to 3.1 micro-ohm cm for aluminum), is less susceptible to electromigration, can be deposited at lower temperatures (thereby avoiding deleterious effects on the device dopant profiles) and is suitable for use in high aspect ratio applications. Copper interconnects can be formed by chemical vapor deposition, sputtering, electroplating and electrolytic plating.

The damascene process is one technique for forming copper interconnects for integrated circuits. A trench is formed in a surface dielectric layer and copper material is then deposited in the trench. Usually the trench is overfilled, requiring a subsequent chemical/mechanical polishing step to replanarize the dielectric surface. This process of depositing copper in a trench offers superior dimensional control because it reduces dimensional variations relative to variations that are introduced in a typical subtractive metal etch process.

Dual damascene copper processes integrally form both the vertical conductive via portion and the substantially horizontal metal interconnect portion of an interconnect system. The via opening is formed first, followed by formation of an overlying trench. A subsequent metal deposition step fills both the via opening and the trench, forming a complete metal layer. A chemical/mechanical polishing step planarizes the deposited metal with respect to the adjacent dielectric surface.

BRIEF SUMMARY OF THE INVENTION

A method for forming an integrated circuit structure comprises providing a semiconductor substrate having an upper surface. A first plurality of conductive lines are formed in a first layer overlying the upper surface. A second plurality of conductive lines are formed in a second layer spaced apart from and overlying the first layer. The first and the second plurality of conductive lines are interconnected to form a helical conductor structure. A core material layer exhibiting ferromagnetic properties is formed between the first and the second layers.

An integrated circuit structure formed according to one embodiment of the present invention comprises a semiconductor substrate and a helical conductor formed over the substrate. A core exhibiting ferromagnetic effects is formed in a region bounded by the helical conductor.

BRIEF DESCRIPTION OF THE DRAWINGS

The present invention can be more easily understood and the advantages and uses thereof more readily apparent, when considered in view of the following detailed description when read in conjunction with the following figures wherein:

FIGS. 1 through 41 illustrate, in a cross-sectional view taken along a common plane or in a plan view when so noted, an inductor structure according to one fabrication embodiment of the present invention during sequential fabrication steps.

FIGS. 49 through 53 illustrate sequential fabrication steps of an inductor structure according to yet another fabrication embodiment of the present invention.

In accordance with common practice, the various described device features are not drawn to scale, but are drawn to emphasize specific features relevant to the invention. Reference characters denote like elements throughout the figures and text.

DETAILED DESCRIPTION OF THE INVENTION

One process for forming an inductor according to the present invention begins as shown in FIG. 1, where a plurality of layers are formed over an existing integrated circuit semiconductor substrate 19 that conventionally includes a plurality of active regions (not shown). In one embodiment according to the teachings of the present invention, fabrication of the inductor begins after formation of the various doped regions, but prior to the formation of metal interconnect layers for connecting the doped regions to form active devices. This sequence of fabrication process steps is not required for implementation of the present invention, but rather is set forth as one example.

A barrier layer 20 overlies an upper surface of the semiconductor substrate 19 and is preferably formed from one or more layers of tantalum, tantalum-nitride, titanium or titanium-nitride. Next an insulating layer 22, preferably formed from a material having a relatively low dielectric constant, is formed over the barrier layer 20. Certain forms of silicon dioxide exhibiting a low dielectric constant can be used for the insulating layer 22. The relative dielectric constant for silicon dioxide is normally about 3.9. A low relative dielectric constant is generally considered to be less than about 3.0. Use of a low dielectric constant material reduces inter-layer capacitance and therefore potential crosstalk between signals carried in conductive structures proximate the insulating layer 22. However, in another embodiment, conventional silicon dioxide can be used. The barrier layer 20 and the insulating layer 22 can be formed by chemical vapor deposition or other known processes.

Figure 3:
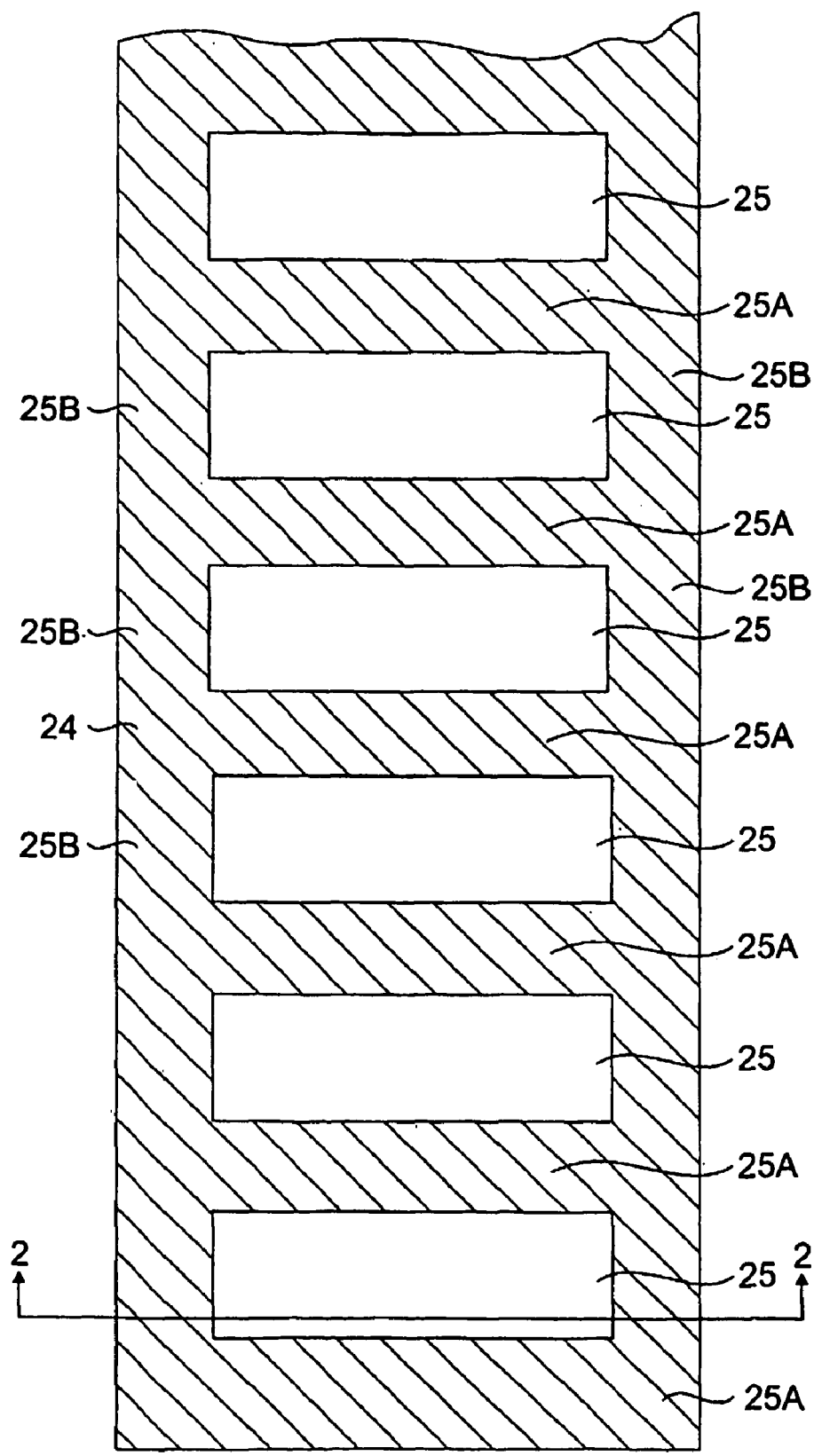

A hard mask layer 24, conventionally comprising silicon dioxide, overlies the insulating layer 22. To etch a layer or layers below a hard mask photoresist material is applied over the hard mask the photoresist is patterned and the pattern is transferred from the photoresist to the hard mask. The photoresist is removed and etching steps are performed using the hard mask pattern. This process advantageously offers better dimensional control of the etched features than the conventional mask, pattern and etch processes, which can, however, be used in lieu of the hard mask. Using either process, a plurality of parallel windows or trenches 25 are formed by etching the insulating layer 22 and the hard mask layer 24. An exposed region of the barrier layer 20 at the bottom of the trenches 25 is removed in a subsequent etch step. One such trench is shown in the cross-sectional view of FIG. 2. A plurality of trenches 25 are illustrated in the top view of FIG. 3. Preferably, in the top view the plurality of trenches 25 are square or rectangular as shown in FIG. 3, but circular or elliptical shapes may be formed if photolithographic limitations, e.g., diffraction effects, do not allow formation of sharp cornered structural shapes. Thus although illustrated as rectangular or square in subsequent figures, windows and trenches, when viewed from the top, can be circular, elliptical, or present relatively straight edges and rounded corners.

Figure 4:
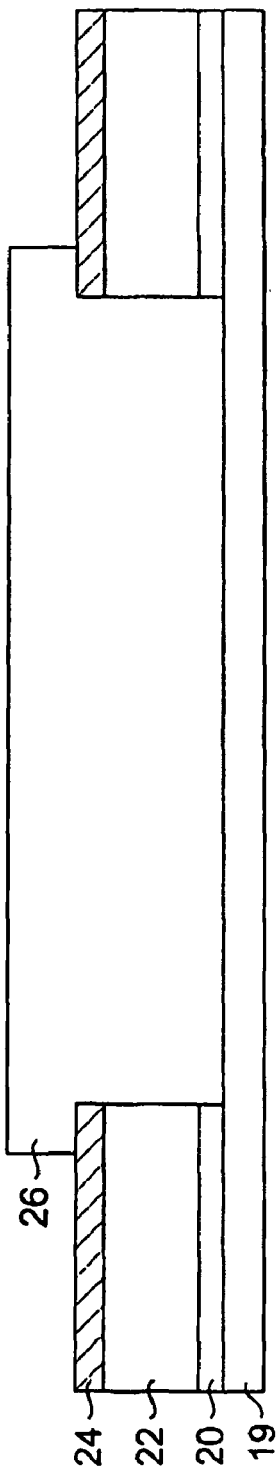

Although the following description refers only to the trench 25 shown in the FIG. 2 cross-section, it should be apparent that each of the plurality of parallel trenches 25 shown in FIG. 3 simultaneously undergoes the same processing steps. As shown in FIG. 4, a silicon buffer layer 26 is formed in the trench 25 of FIG. 2, for example, by epitaxially growing the silicon from the underlying silicon substrate 19. It is not necessary for the silicon seed layer (i.e., the silicon substrate 19) to exhibit a specific crystal orientation, although a Miller Index of <111> is preferred. As discussed below, while the use of other crystalline orientations does not require a change in the process steps to form the quantum dots, the crystal orientation does affect the size and spacing of the formed dots. As shown in FIG. 4, the silicon buffer 26 extends laterally beyond the side walls of the trench 25.

Lacking a silicon seed layer, silicon does not grow in regions 25A (see FIG. 3) between the parallel trenches 25, and regions 25B laterally adjacent the trenches 25, as the hard mask 24 forms the upper layer in the regions 25A and 25B.

The regions 25A and 25B and all other regions of the substrate surface, exclusive of the silicon buffers 26 (which are the growth surfaces during subsequent process steps) are masked with a photoresist 27 to prevent processing in these regions. See FIG. 5 where the photoresist 27 is shown in the regions 25B laterally adjacent side walls 28 of the silicon buffer 26.

Figure 6:
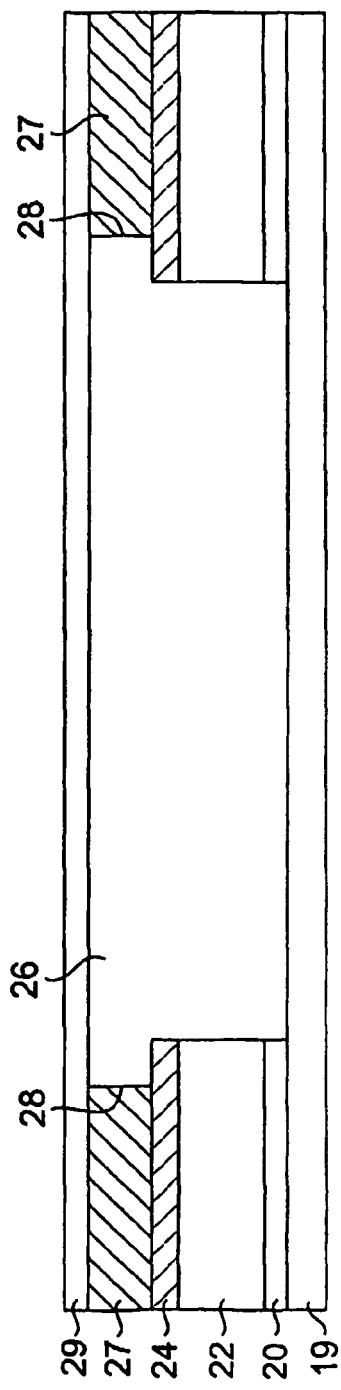

As shown in FIG. 6, a thin germanium wetting layer 29 is deposited over a top surface of the silicon buffer 26 and the photoresist 27. Preferably this layer is about 5 to 30 Angstroms thick, i.e., a few monoatomic layers. The germanium layer 29 may be formed by a conventional plasma vapor deposition process or another know technique.

Figure 7:
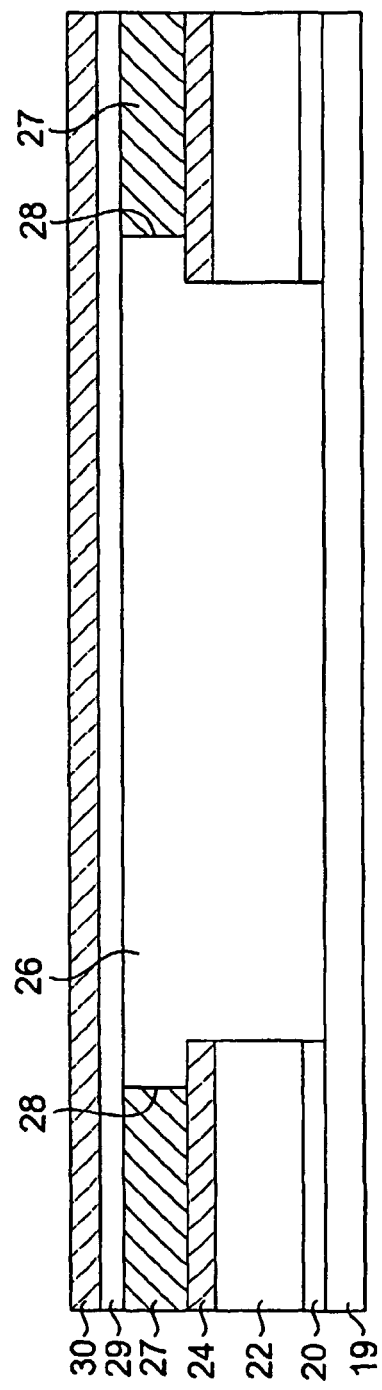
Figure 8:
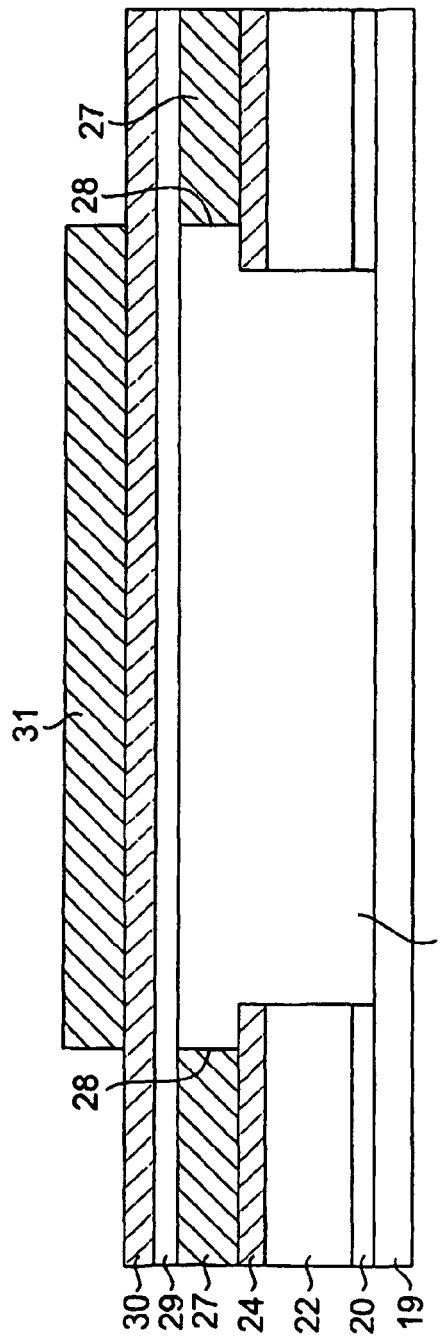

During the next several processing steps the germanium layer 29 is patterned. In FIG. 7, a hard mask layer 30 is deposited over the upper surface of the structure. A photoresist layer 31 is deposited, exposed, patterned and etched, resulting in the structure illustrated in FIG. 8.

Figure 9:
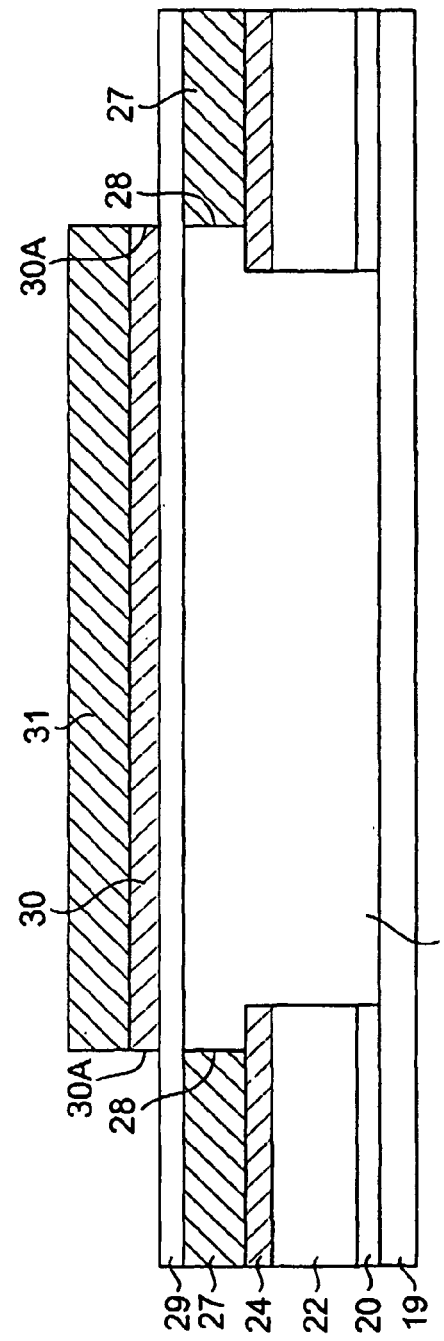
Figure 10:
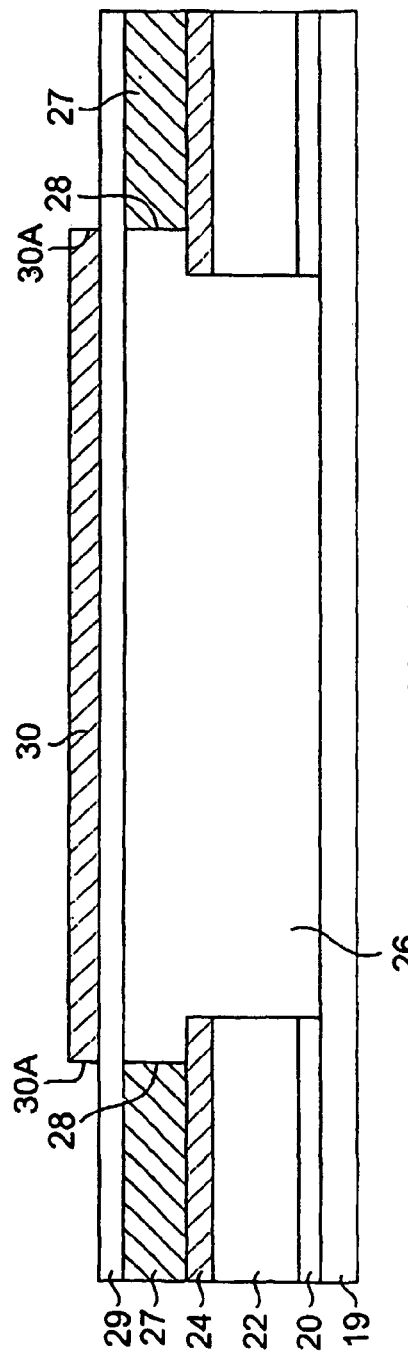

As illustrated in FIG. 9, the hard mask layer 30 is etched to vertically align the side walls 30A thereof with the side walls 28. The photoresist layer 31 is removed and the resulting structure illustrated in FIG. 10.

Figure 11:
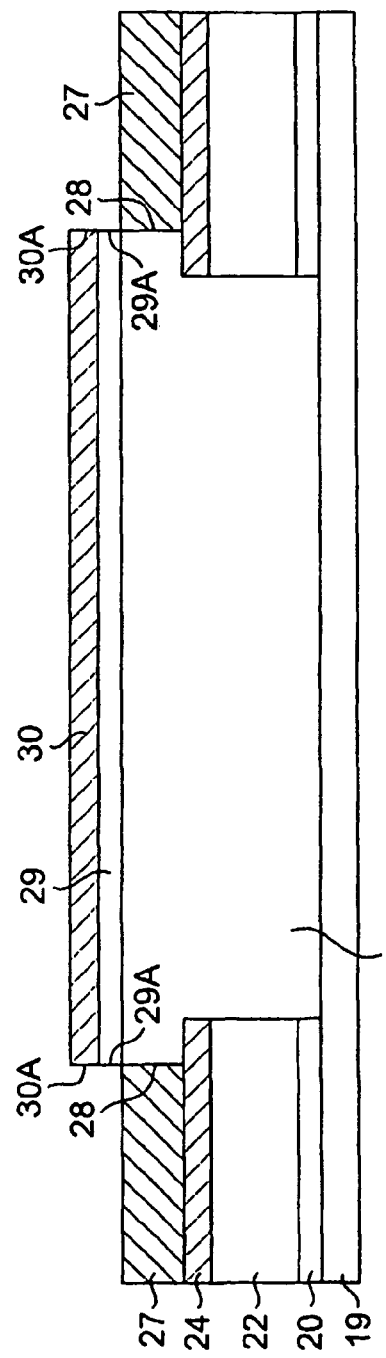
Figure 12:
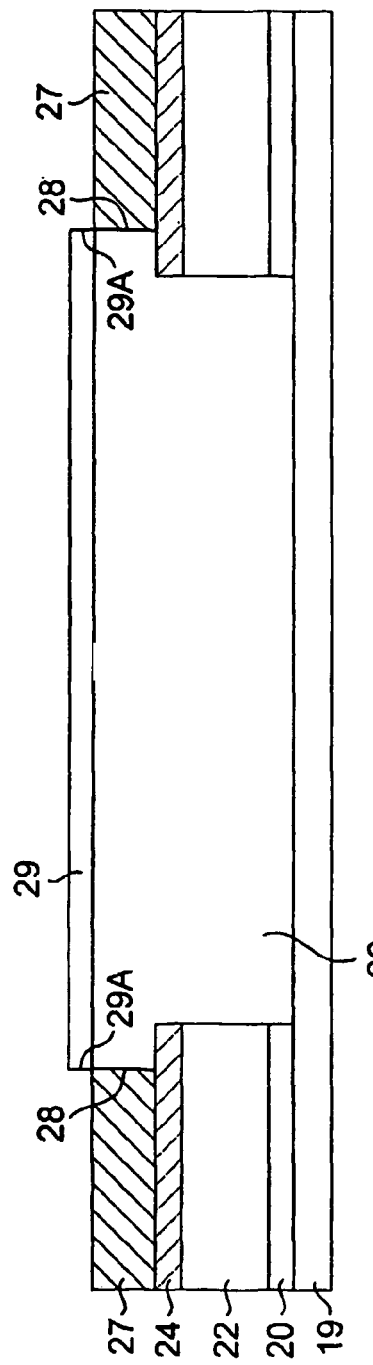

As shown in FIG. 11, the germanium layer 29 is etched back so that side walls 29A thereof are aligned with the side walls 28 and 30A. The hard mask layer 30 is removed, and the resulting structure illustrated in FIG. 12.

Figure 13:
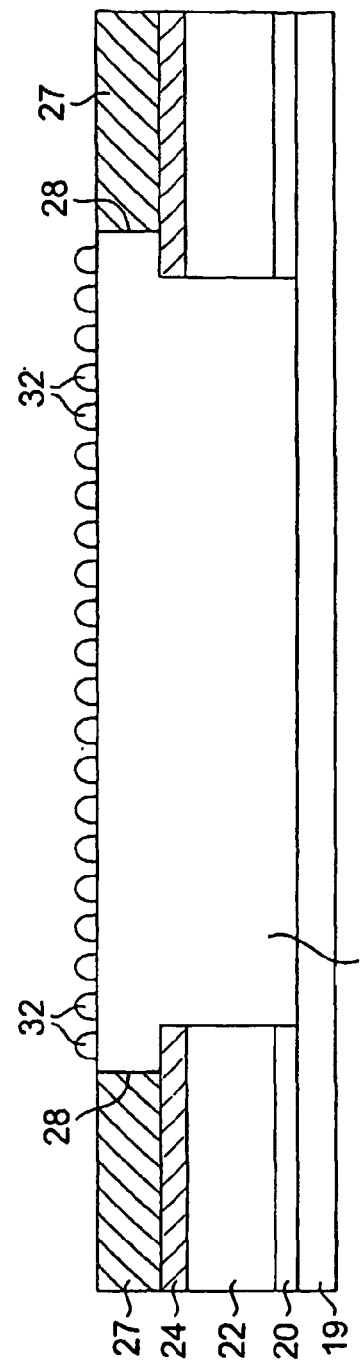

The structure is then annealed, preferably at a temperature between about 400 and 500° C. for about 5 to 10 minutes. The material of the photoresist layer 27 is selected to match the conditions of the anneal process such that the photoresist 27 is not detrimentally affected by the anneal. The anneal process forms a matrix of germanium quantum dots 32 (also referred to as semiconductor material islands). The quantum dots 32 are elemental germanium islands formed by the preferential growth of the germanium at steps and out-of-phase boundaries on the top surface of the silicon buffer 26 during the surface bond reconstruction process that occurs during the anneal. See FIG. 13.

Figure 14:
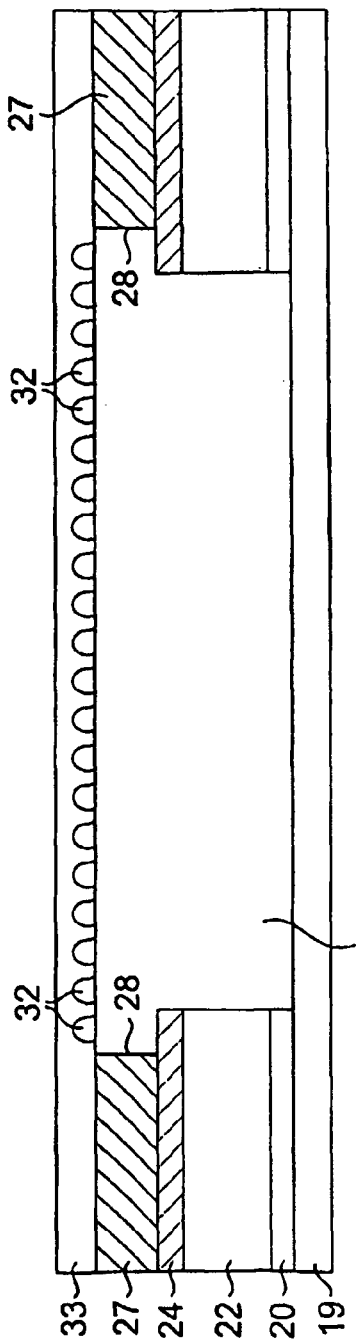

About a few monolayers of ferromagnetic material 33 are deposited (for instance by plasma vapor deposition) at room temperature over the quantum dots 32, as shown in FIG. 14. Preferably the ferromagnetic material 33 is about 1–5 atomic layers thick Nickel, iron, cobalt and gadolinium are all suitable ferromagnetic materials. Other elements and compounds that exhibit ferromagnetic properties are also suitable, but for purposes of illustration, the process is described using cobalt as the ferromagnetic material 33.

Figure 15:
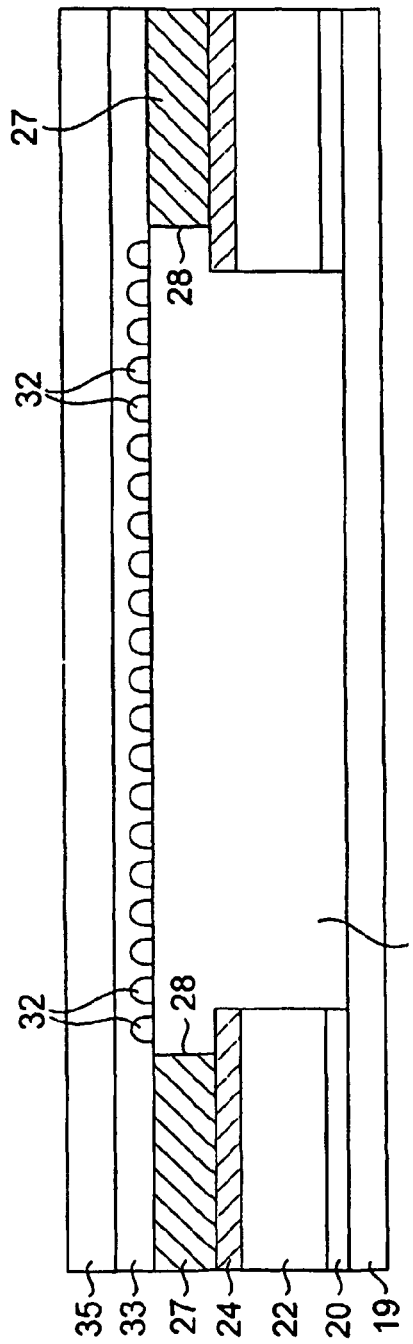

The process continues with the deposition of a dielectric layer 35 as shown in FIG. 15. A photoresist layer is deposited over the dielectric layer 35 and exposed, patterned, and etched to form the photoresist layer 36 illustrated in FIG. 16. According to the next process step, the dielectric layer 35 is etched back to vertically align the side walls 35A thereof with the side walls 28. See FIG. 17. The photoresist layer 36 is then removed. The structure at this point in the process is shown in FIG. 18.

Exposed regions 33A of the ferromagnetic material 33 are removed by etching. The dielectric layer 35 is then removed, also by etching. The structure at this point in the process is illustrated in FIG. 19, illustrating the quantum dots 32 and the ferromagnetic material 33.

Figure 20:
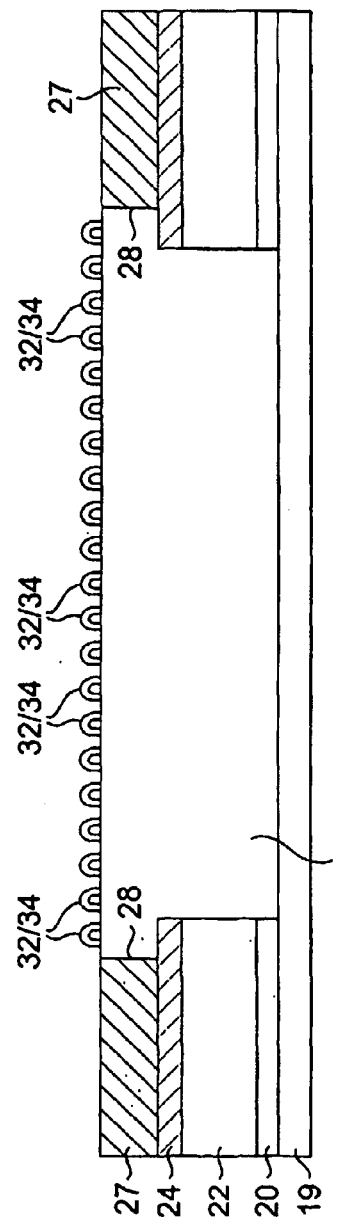

The structure is annealed at about 400–500° C., for five to ten minutes, during which a cobalt-germanium phase layer forms within the quantum dots 32. Different combinations of anneal temperature and anneal duration can be used to form the metal-germanium phase layer. Due to the low anneal temperature, the germanium does not react with the underlying silicon buffer 26 to form a SiGe alloy. The anneal process causes the cobalt to diffuse downwardly to the silicon-germanium interface, where a thin CoSi2 (cobalt-silicide) layer is formed within the quantum dots 32. See FIG. 20 where the captured cobalt is identified by a reference character 34. Selective sputtering removes any silicide between adjacent quantum dots 32. The resulting structure comprises a layer of germanium quantum dots 32 with CoSi2 34 completely encapsulated therein.

Each Ge/CoSi2 quantum dot 32/34 is a flat-band energy structure in which the electrons are confined three-dimensionally inside a region that is surrounded by high potential energy regions. Thus the Ge/CoSi2 quantum dots 32/34 containing a single, three-dimensionally confined electron can be considered an individual magnetic domain. Different combinations of anneal temperature and duration can be used to form the Ge/CoSi2 quantum dots 32/34, but the anneal step must be compatible with the back-end fabrication steps where it is know that the use of high temperatures can disturb the active region dopant profiles and impair previously-formed metal interconnect layers. Also, the anneal temperature and duration can affect the size and spacing of the Ge/CoSi2 quantum dots. This process of forming quantum dots through an anneal step is known in the art. See for example, 1. H. Hibino and T. Ogino, Appl. Phys. Lett., vol. 67 no. 7, 1995, pp. 915–917; U. Kohler, J. E. Demuth, and R. J. Hamers, J. Vac. Sci. Technol. A, vol. 7 no. 4, 1989, pp. 2860–2867; J.-H. Zhu, K. Brunner, and G. Abstreiter, Mat. Res. Soc. Symp. Proc., vol. 533, 1998, pp. 165–170.

To form quantum dots according to other embodiments of the present invention other semiconductor materials and compound semiconductor materials can be used in lieu of the germanium, including any of the group III–V compound semiconductors such as GaAs, InAs, GaInAs, AlAs, and GaAlAs, the group IV semiconductors such as Si and SiGe and the group II–VI compound semiconductors such as CdTe.

The resulting captured cobalt-silicide (or in another embodiment the silicide of another ferromagnetic material) is in a stable single domain configuration and thus exhibits ferromagnetic properties. Due to the presence of the captured cobalt-silicide in the inductor core, the inductor coercive fields are approximately eight times the value absent the ferromagnetic core. Although the cobalt-silicide islands are single magnetic domains, coupling between individual Ge/CoSi2 quantum dots 32/34 produces characteristics similar to a continuous ferromagnetic material, resulting in a further increase in the ferromagnetic effect exhibited by individual Ge/CoSi2 quantum dots 32/34.

In addition to the processes set forth above for forming the Ge/CoSi2 quantum dots 32/34, similar, and possibly more advantageous configurations may be produced, such as by: deposition of a magnetic film on a flat wafer and etching to form quantum dots (O. Kazakova, M. Hanson, P. Bloomquist, and R Wappling, J. Appl. Phys. 90, p. 2440–2446, 2001), deposition of a magnetic film on an array of silicon dots prepared by electron beam lithography and reactive etching (S. Landis, B. Rodmacq, and B. Dieny, Phys. Rev. B 62, p. 12271–12281), and electrodeposition of ferromagnetic material on silicon electrodes (C. A. Moina and M Vazdar, Electrochemistry Comm. 3, p. 159–163, 2001).

In another embodiment it may be unnecessary to enclose ferromagnetic material within the Ge/CoSi2 quantum dots 32/34 to form an inductor core exhibiting ferromagnetic effects. For example, it is known that arrays of semiconductor material in the form of islands on a semiconductor surface also exhibit ferromagnetic properties. See H. Tamura, K. Shiraishi and H. Takayanagi, Jap. J. Appl. Phys, Part 2-Letters, vol. 39 no. 3AB, 2000, pp. L241–243. Thus according to such an embodiment of the present invention, the quantum dots 32 form an inductor core without the use of the ferromagnetic material captured therein.

Figure 21:
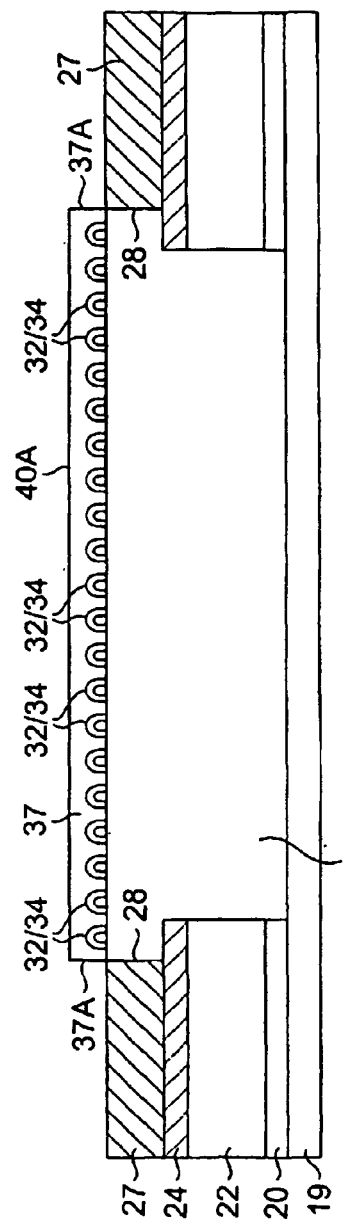

As shown in FIG. 21, a silicon layer 37 is deposited or grown over the Ge/CoSi2 quantum dots 32/34. Note that the side walls 37A of the silicon layer 37 are shown in FIG. 21 as vertically aligned with the side walls 28. In an embodiment where the silicon layer 37 is grown from the silicon buffer 26, the structure of FIG. 21 results. In another embodiment using a silicon deposition process, the silicon layer 37 extends laterally beyond the side walls 28 to the edges of the FIG. 21 structure. In this latter embodiment, it would be advantageous to execute a series of known masking, patterning, and etching steps to remove regions of the silicon layer 37 such that in the resulting structure the side walls 37A are vertically aligned with the side walls 28.

Figure 22:
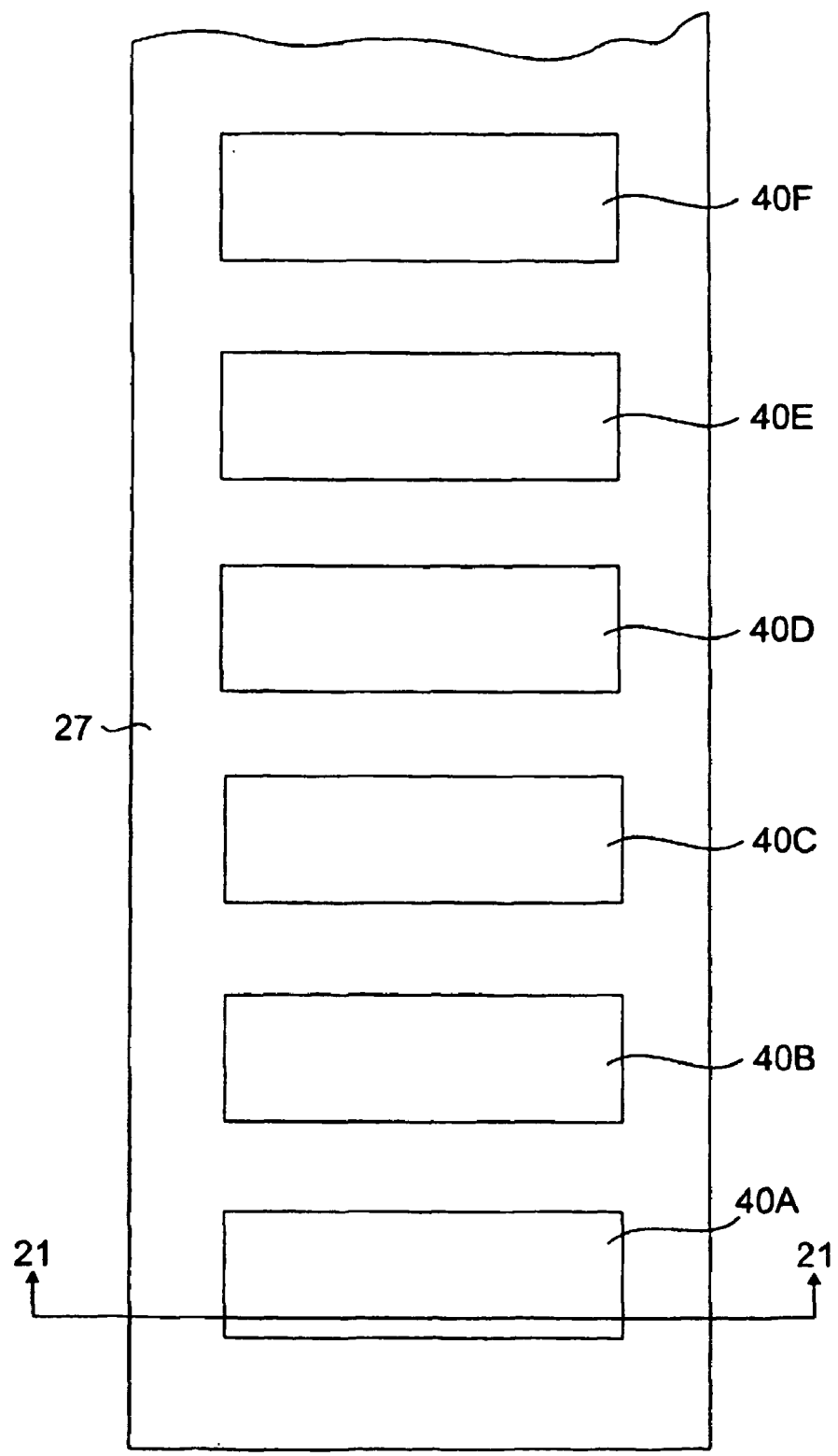

In an embodiment where an inductor core segment 40A comprises a single layer of the Ge/CoSi2 quantum dots 32/34, fabrication of the inductor core segment 40A is complete. In the top view of FIG. 22 a core 40 comprises a plurality of the parallel core segments 40A–40F. The cross-sectional view of FIG. 21 is taken along a plane 21/21 of FIG. 22.

Figure 23:
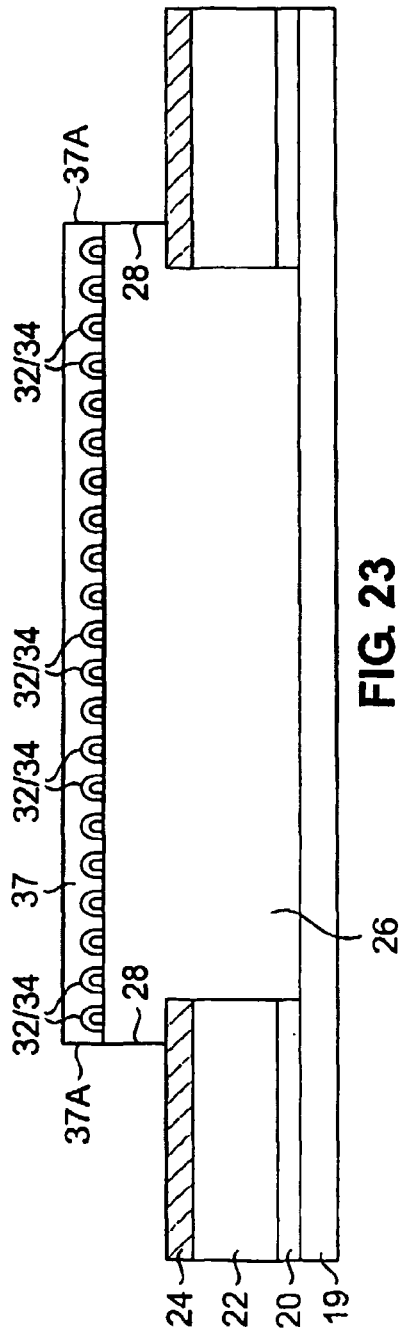

The photoresist mask 27 is removed for subsequent processing steps to form substantially horizontal conductive runners and substantially vertical conductive vias, together which form the inductor windings enclosing the inductor core 40. The resulting structure after removal of the photoresist mask 27 is illustrated in FIG. 23. In another embodiment, it may be necessary to remove the hard mask layer 24 to form the conductive runners and vias. The formation of the conductive runners and vias is explained below in conjunction with another embodiment of the invention.

In an embodiment where the core 40 comprises additional layers of Ge/CoSi2 quantum dots 32/34, the photoresist mask 27 is retained and the process steps set forth above are repeated to sequentially form additional vertically disposed layers of the Ge/CoSi2 quantum dots 32/34. In this embodiment, the height of the photoresist mask 27 is increased to accommodate the higher quantum dot stack.

The next layer of the Ge/CoSi2 quantum dots 32/34 is formed over the silicon layer 37, which serves as a substrate for the overlying layer of Ge/CoSi2 quantum dots 32/34. The process steps are substantially identical to those described above for formation of the first layer of Ge/CoSi2 quantum dots 32/34. A germanium layer is deposited on the silicon layer 37, patterned and etched, then annealed to form the quantum dots 32. A layer of ferromagnetic metal (cobalt, for example) is deposited and annealed to form the Ge/CoSi2 quantum dots 32/34. An overlying silicon layer is grown or deposited to serve as a substrate for the next vertical layer of quantum dots.

Figure 24:
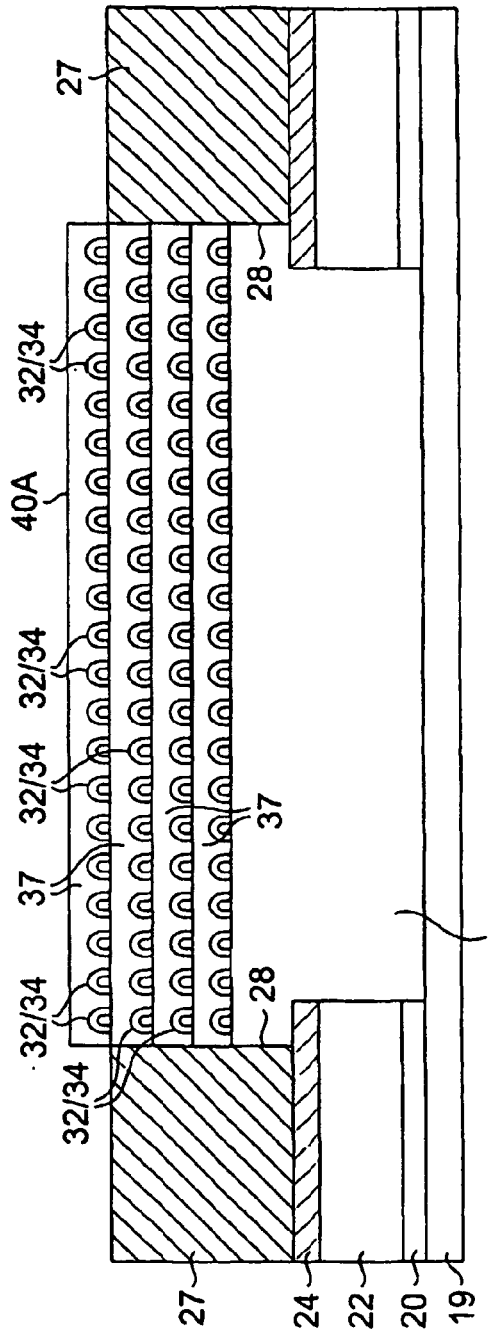

Four such layers of quantum dots 32/34 forming an inductor core segment 40A are shown in FIG. 24. The addition of more layers of Ge/CoSi2 quantum dots 32/34 or an increase in the concentration of the germanium in each germanium layer 33 (e.g., by increasing the size of or decreasing the distance between the quantum dots 32) increases the permeability of the inductor core segment 40A, and thus the permeability of the core 40 and the inductance.

In preparation for forming the conductive runners and vias that form the inductor windings, the photoresist mask 27 is removed, as shown in FIG. 25. It may also be necessary to remove the hard mask layer 24.

Figure 27:
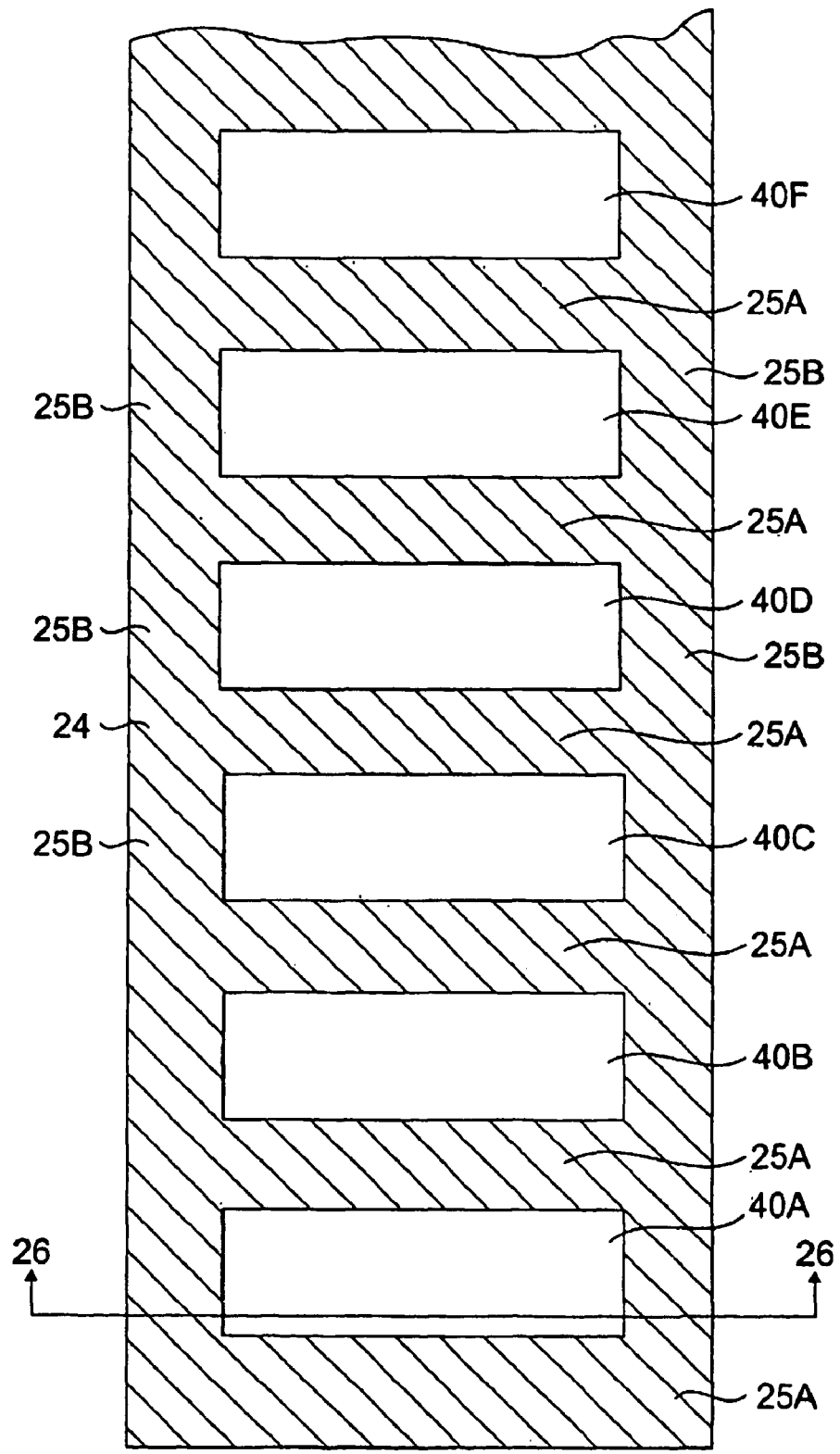

A region 41 (see FIG. 25) of the multilayer inductor core segment 40A (and the other segments 40B–40F parallel thereto) extending beyond die side walls of the trench 25 can be removed by employing conventional masking, patterning and etching steps. The result is a core segment 40A that is aligned with the trench side walls 28A as shown in FIG. 26. In the top view the structure is illustrated in FIG. 27, where the plurality of multilayer core segments 40A–40F comprise the mukilayer inductor core 40. FIG. 26 is taken along a plane 26/26 of F*igure* 27.

In the subsequent process steps the conductive runners (also referred to as conductive leads, lines, or strips) and vias are formed. In a preferred embodiment employing the damascene (or dual damascene) process, the lower and upper conductive runners are interconnected by the conductive vias to form the inductor windings. The core segments 40A–40F are disposed within an open region defined by the conductive elements of each winding.

Figure 28:
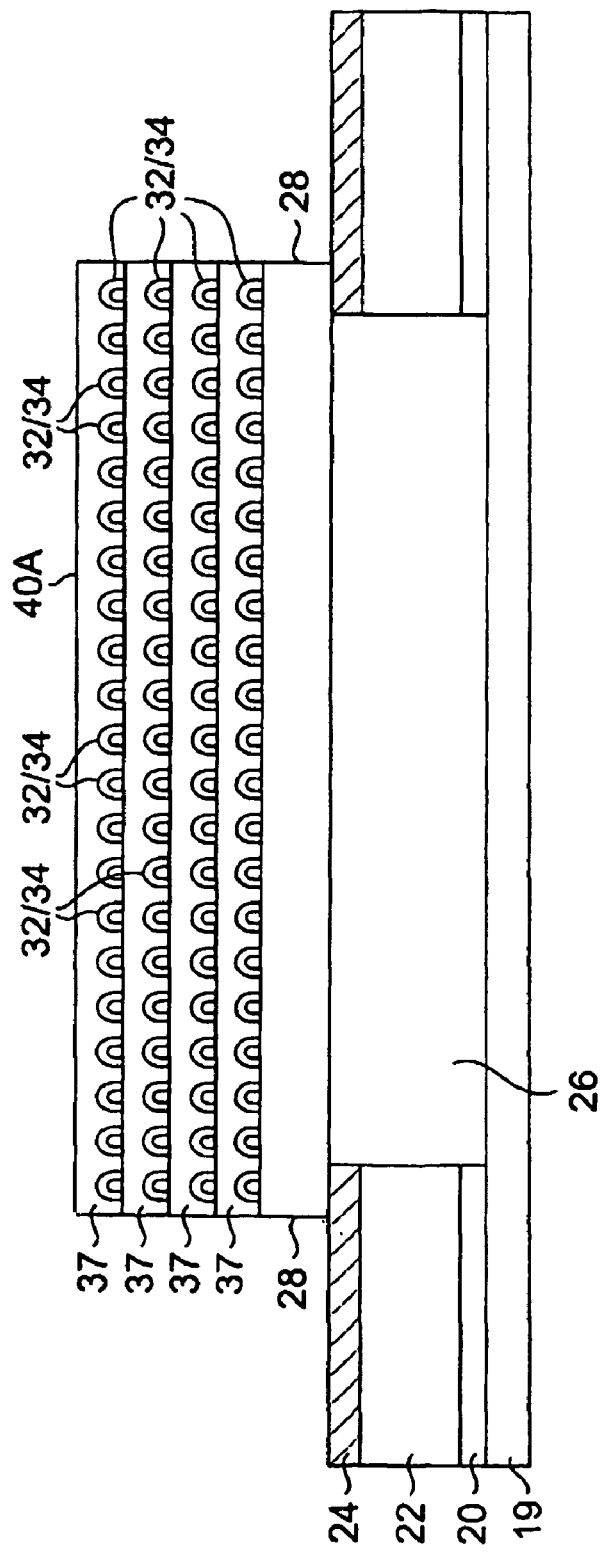
Figure 29:
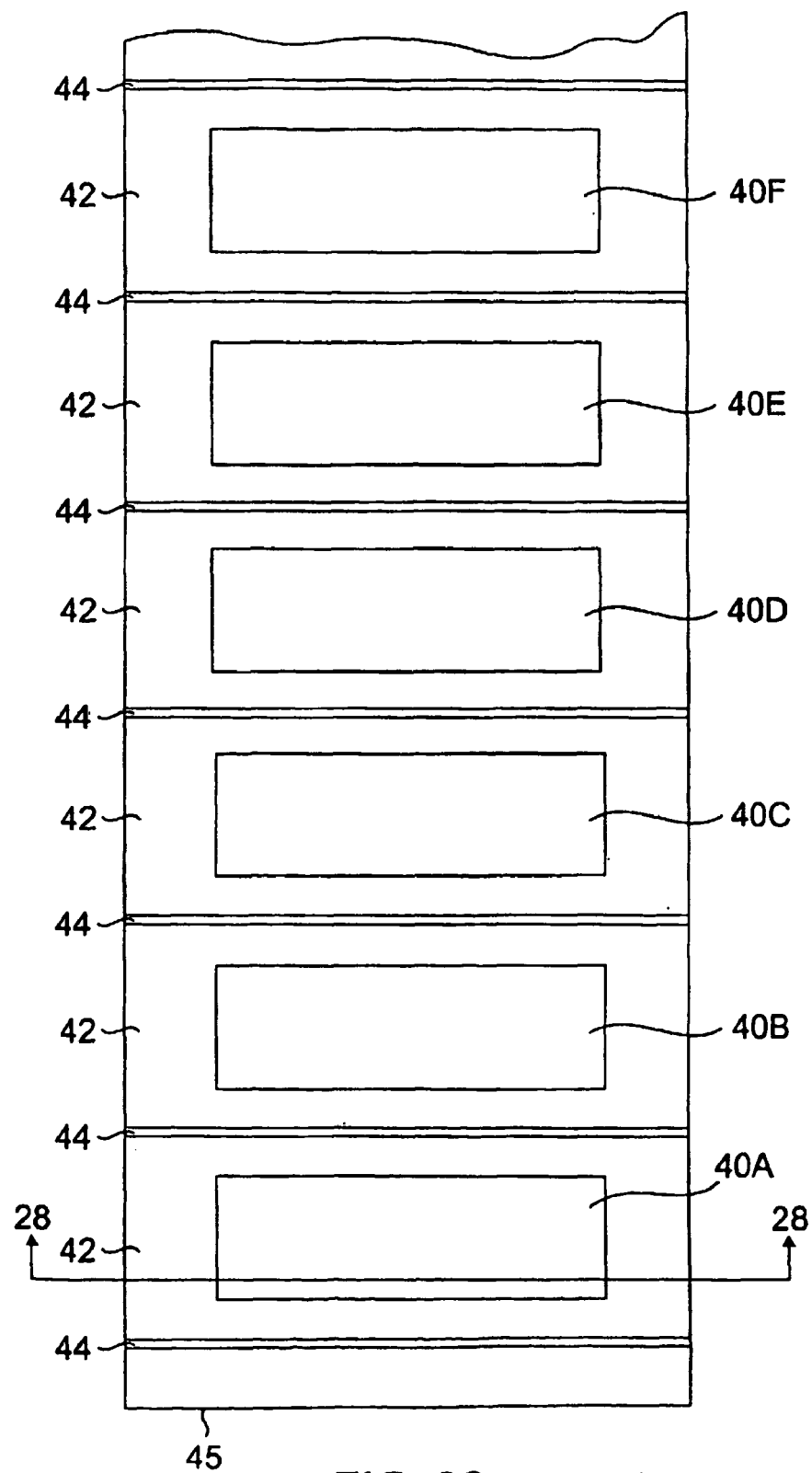

A trench 42 (for carrying a lower conductive runner) is formed in the insulating layer 22 surrounding each inductor core segment 40A–40F. See the cross-sectional view of FIG. 28 and the FIG. 29 plan view, where the FIG. 28 cross-section is taken along the plane 28/28 of FIG. 29. FIG. 29 illustrates a plurality of trenches 42 formed surrounding each one of the plurality of parallel inductor core segments 40A–40F. As can also be seen in FIG. 29, an insulating layer 44 is formed between each of the trenches 42. Although the inductor core segments 40A–40F and the trenches 42 in FIG. 29 are shown parallel with a front surface 45 of the substrate, this orientation is not necessarily required.

Figure 30:
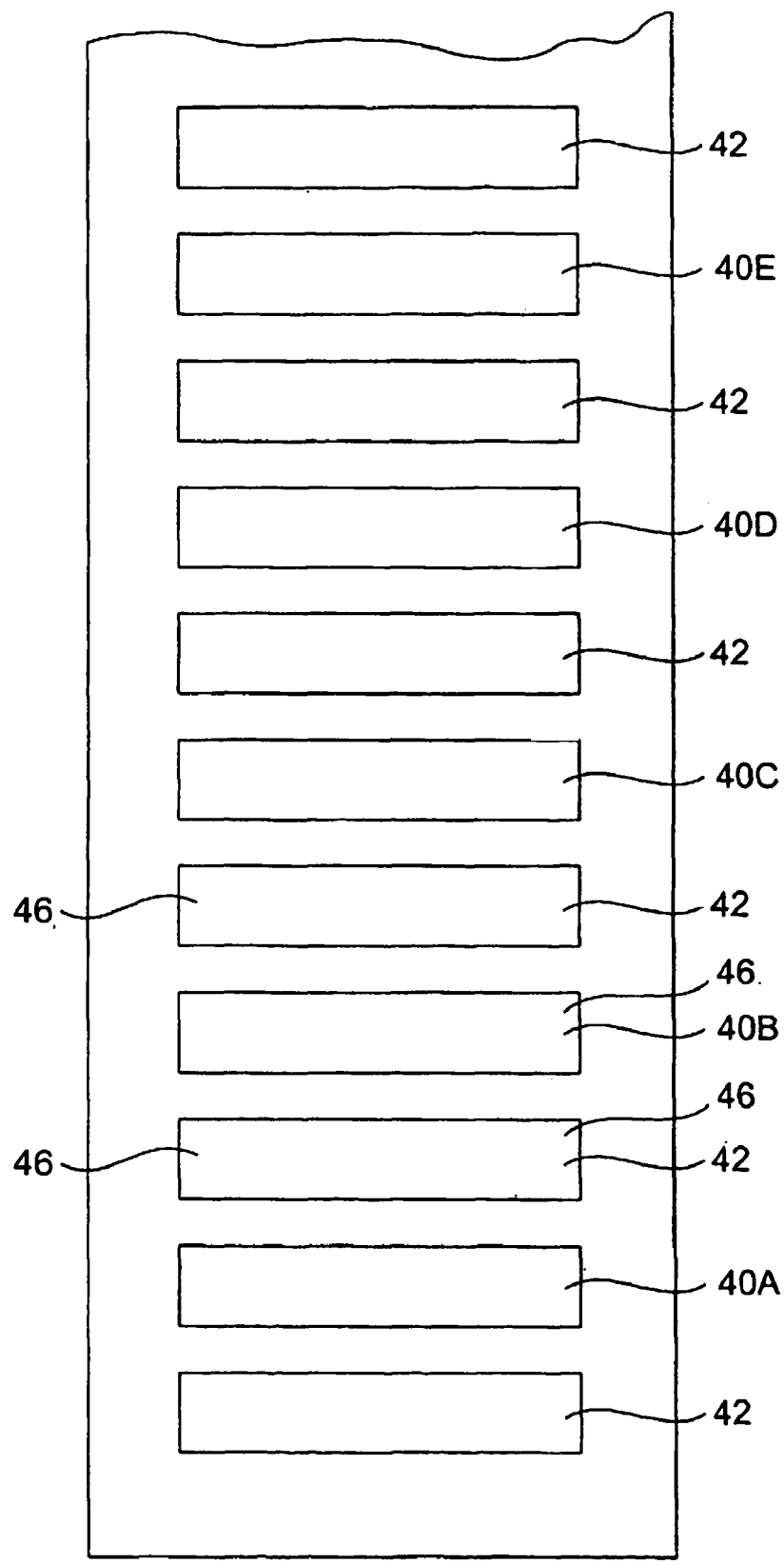

In another embodiment a trench for a lower runner is formed between each of the plurality of parallel core segments 40A–40F. See FIG. 30. The relative size and spacing of the trenches 42 and the core segments 40A–40F can be varied. With reference to FIG. 30, conductive vias are later formed generally in regions 46. Upper conductive runners are formed in electrical communication with the conductive vias such that one upper conductive runner interconnects two consecutive lower conductive runners through the vias.

Subsequent steps for fabricating the inductor windings involve only the conductive structures, therefore the inductor core segments 40A–40F are masked, as required, to avoid deleterious effects from subsequent process steps.

Figure 31:
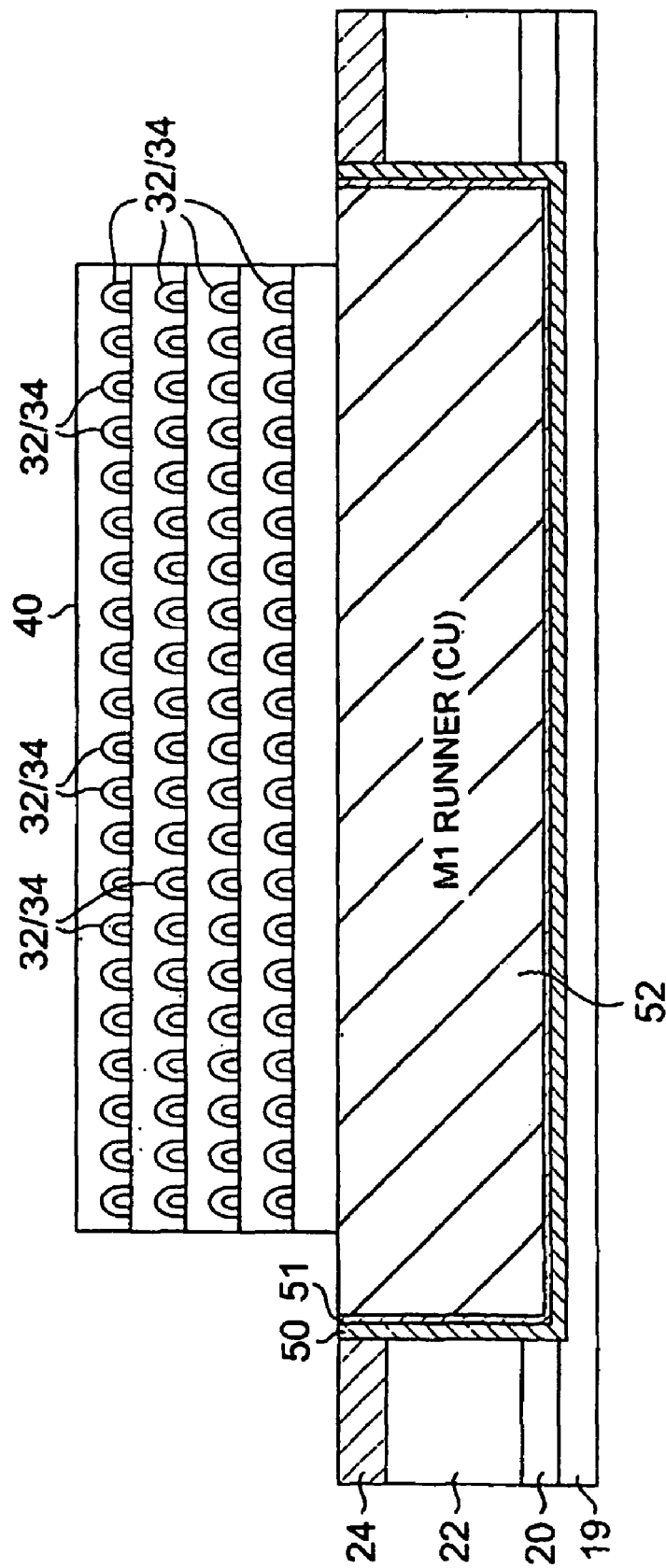

As shown in FIG. 31, a barrier layer 50 and a seed layer 51 are deposited along the side walls and bottom of the trenches 42. The material of the barrier layer 50 is sputtered into the trench 42. Tantalum, tantalum-nitride, titanium and titanium-nitride are candidate materials for the barrier layer 50. Next, a thin copper seed layer 51 is deposited, preferably by sputtering. The seed layer 51 is advantageous as a starting layer for the subsequent electroplating of copper. Alternatively, the barrier layer 50 and the seed layer 51 may be deposited by conventional chemical vapor deposition or electroplating processes.

A metal-1 conductive runner 52 is formed in the trench 42, preferably by electroplating copper. The substrate is then chemically-mechanically polished to remove the electroplated copper from all regions except within the trench 42. Because the chemical/mechanical polishing (CMP) step is selective to the copper material, the ferromagnetic core 40 that lies behind and extends above the metal-1 runner 52 is not affected by the CMP process.

In another embodiment, not shown, the conductive runner is formed prior to forming the inductor core of Ge/CoSi2 quantum dots 32/34.

Additional details regarding damascene processing are discussed in C. K. Hu et. al., Proceedings MRS Symposium on VLSI, vol. 5, p. 369 (1990); B. Luther et. al., Proceedings VMIC, vol. 10, p. 15 (1994); D. Edelstein, Proceedings ECS Mtg., vol. 96–2, p. 335 (1996), all of which are incorporated by reference. It is not necessary, however, to employ a damascene process to form the various metal layers of the inductor. In another embodiment, conventional subtractive metal etch processing steps may be employed.

In certain circuit configurations it may be necessary to connect the metal-1 runner 52 to underlying active device regions in the substrate. For example, one end of the metal-1 runner may serve as an inductor terminal for connection to another circuit component. This can be effected in a dual damascene process by first forming a via opening to an underlying device region. Subsequently a trench, e.g., the trench 42, is formed and the via opening and the trench portion are simultaneously filled with conductor, e.g., electroplated copper, to form an underlying conductive via connected to the metal-1 runner 52. Thus electrical connections to the metal-1 runner 52 serve as terminals for the inductor.

Figure 32:
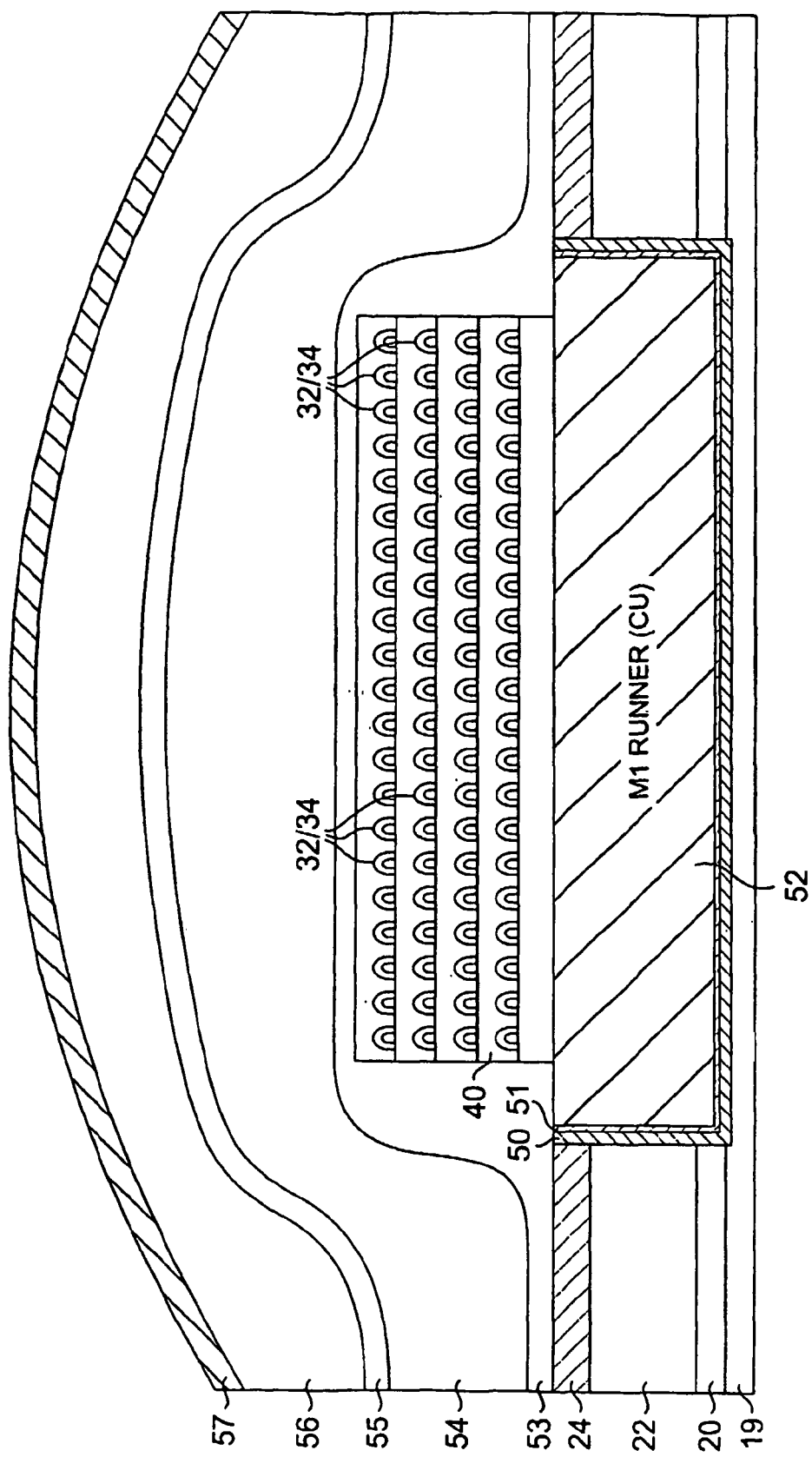

As shown in FIG. 32, a five-layer stack comprising deposited layers 53, 54, 55, 56 and 57 is formed over the entire region of the substrate where the inductor is to be formed, including the region overlying the metal-1 runner 52, the adjacent exposed regions of the hard mask layer 24 and the inductor core 40. The five-layer stack has a generally conformal shape over the inductor core 40.

To form this stack, a barrier layer 53 (preferably of titanium-nitride) is deposited and an insulating layer 54, preferably having a relatively low dielectric constant, is formed over the barrier layer 53. An etch stop layer 55, for example silicon-nitride, is formed over the insulating layer 54. Another low-dielectric constant insulating layer 56, is formed over the etch stop layer 55. A hard mask layer 57 is formed over the insulating layer 56. As discussed above, conventional photoresist and masking material can be used in lieu of the hard-mask layer 52.

Figure 33:
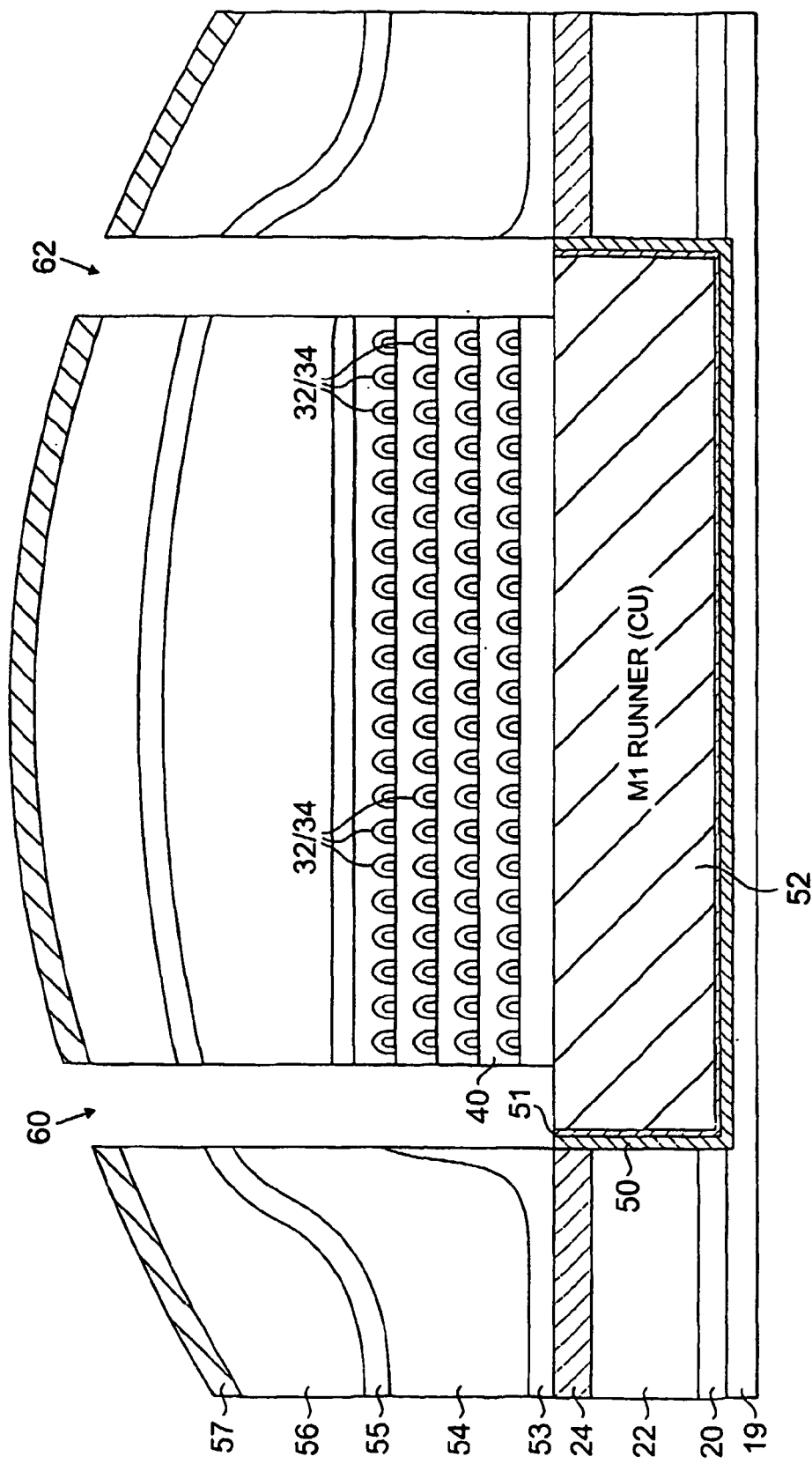

The hard mask layer 57 is patterned to define areas where openings 60 and 62 are to be formed. See FIG. 33. The openings 60 and 62 extend downwardly to the barrier layer 53, and the exposed regions of the barrier layer 53 are removed by etching. Typically, at this point in the integrated circuit fabrication process there are other areas of the integrated circuit that require metal-2 layer interconnects with underlying device regions, and thus the via openings for those interconnects are patterned and etched when the via openings 60 and 62 are formed.

Figure 34:
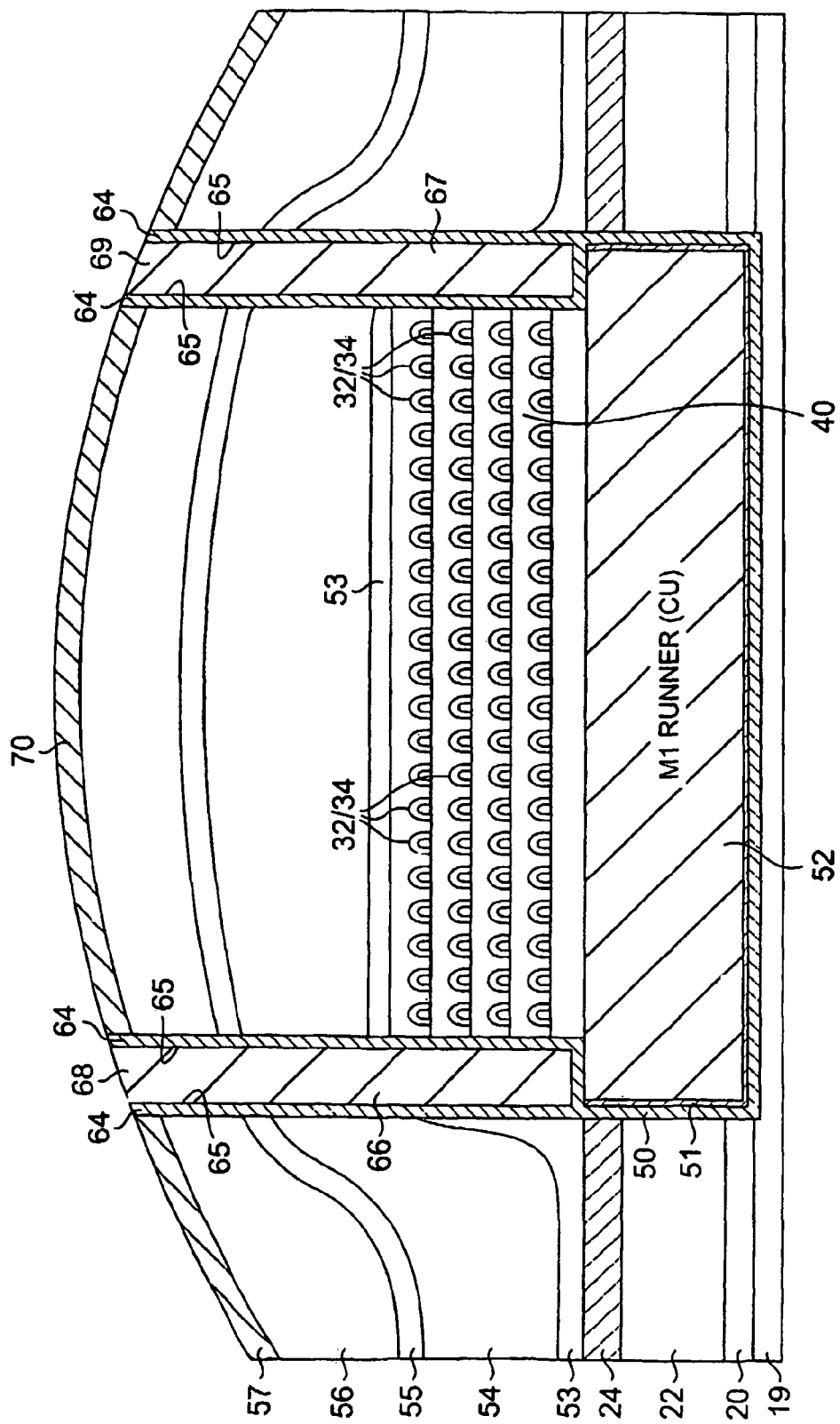

As illustrated in FIG. 34, a barrier layer 64 and a seed layer 65 are deposited within the via openings 60 and 62. The process and materials are identical to those discussed in conjunction with the barrier layer 50 and the seed layer 51 of FIG. 31. Copper is then preferably electroplated within the via openings 60 and 62, followed by a chemical and mechanical polishing step to planarize the top surface. The copper regions in the lower portion of the openings 60 and 62 are referenced in the Figures as conductive vias 66 and 67. The copper regions in the upper portion of the openings 60 and 62 is referenced in the Figures as metal-2 vias 68 and 69.

Figure 35:
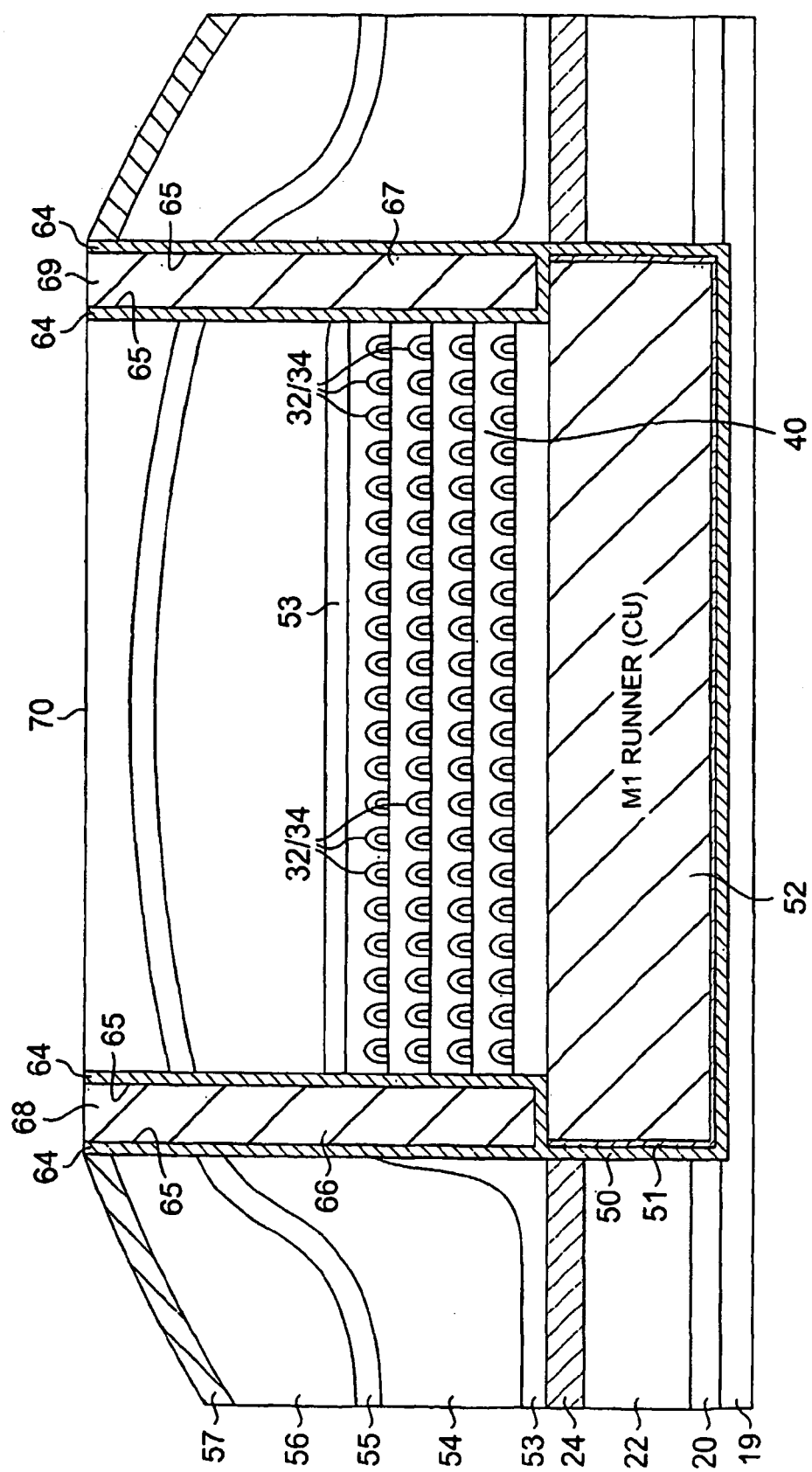

If required, a CMP step is performed to planarize a top surface 70 of the substrate before formation of the subsequent layers. FIG. 35 illustrates the substrate after the CMP step.

Figure 36:
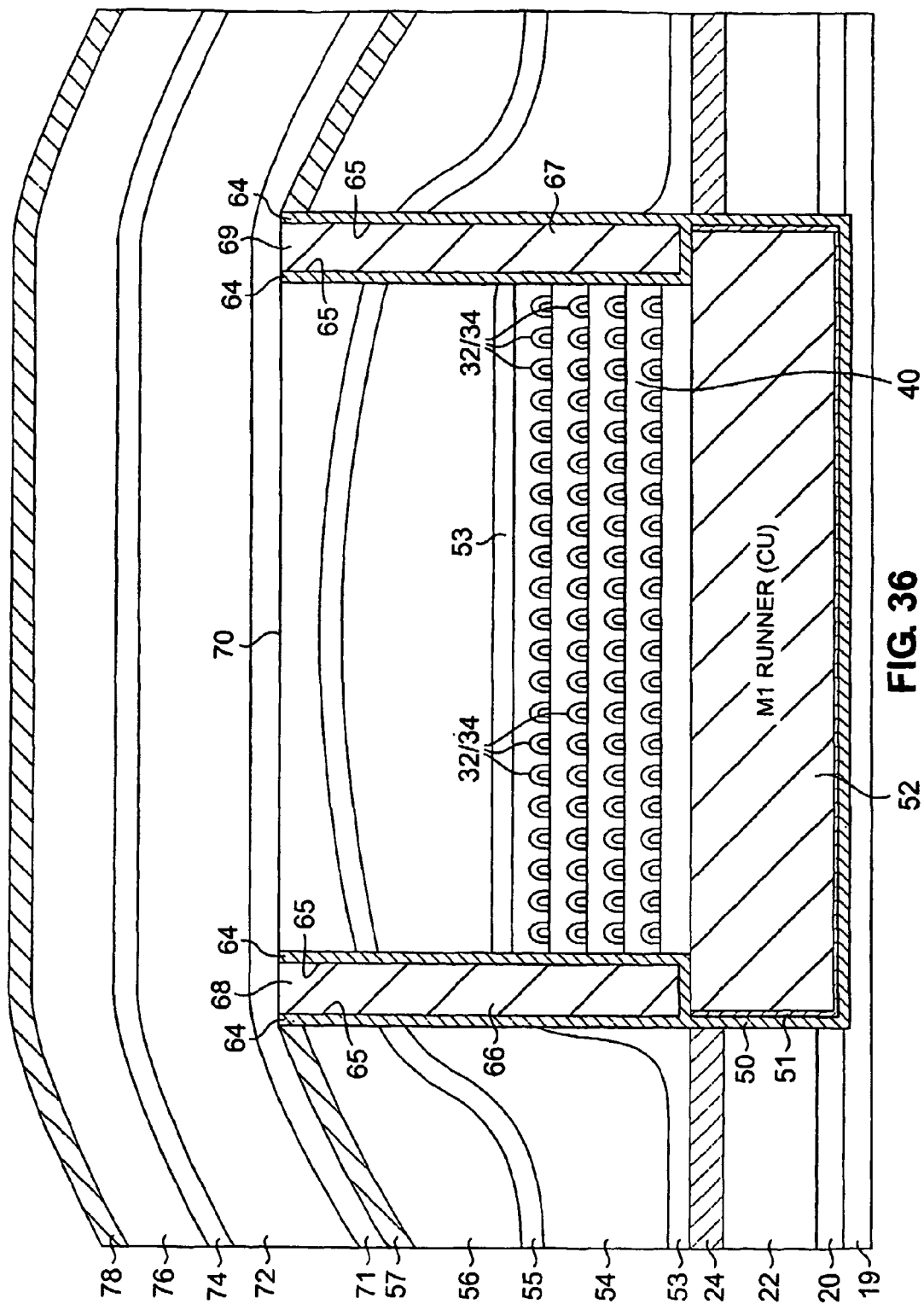

As shown in FIG. 36, a multilayer stack comprising layers 71, 72, 74, 76 and 78 is formed over the existing layers, where the material of the individual layers is preferably identical to the materials used in the multilayer stack discussed in conjunction with FIG. 17. In particular, the layers formed sequentially include a barrier layer 71, an insulating layer 72 (preferably comprising material having a low dielectric constant), an etch stop layer 74, an insulating layer 76 (again preferably comprising a low dielectric constant material, and a hard mask layer 78. Conventional photoresist and masking processes can be used in lieu of the hard mask layer 78 to pattern and etch the surface.

Figure 37:
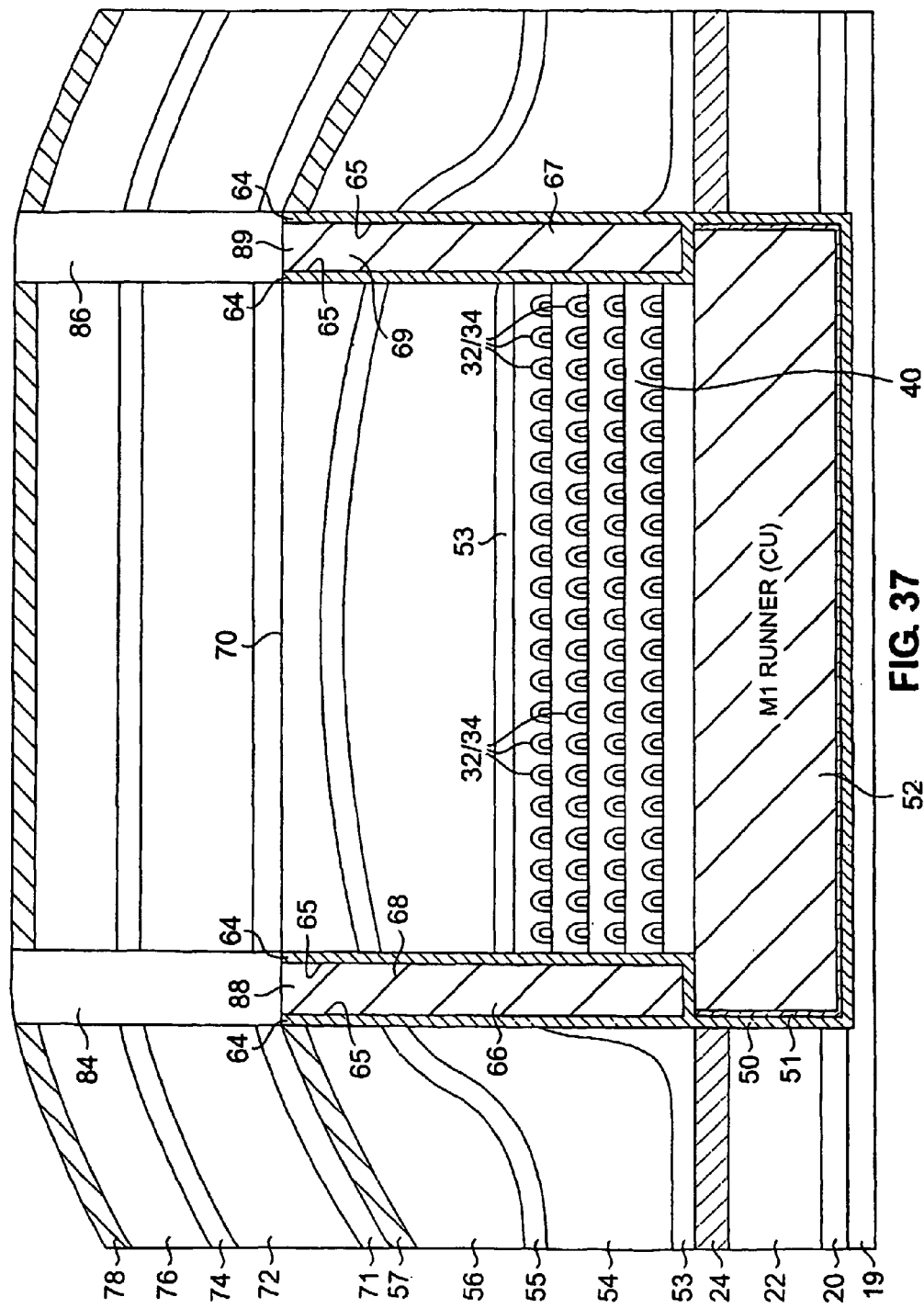

As illustrated in FIG. 37, via openings 84 and 86 are formed within the multilayer stack, using the hard mask layer 78 to pattern and etch the surface such that the via opening 84 is aligned with the top surface 88 of the metal-2 conductive via 68, and the via opening 86 is aligned with the top surface 89 of the metal-2 conductive via 69. The exposed regions of the barrier layer 71 within the via openings 84 and 86 is removed.

Figure 38:
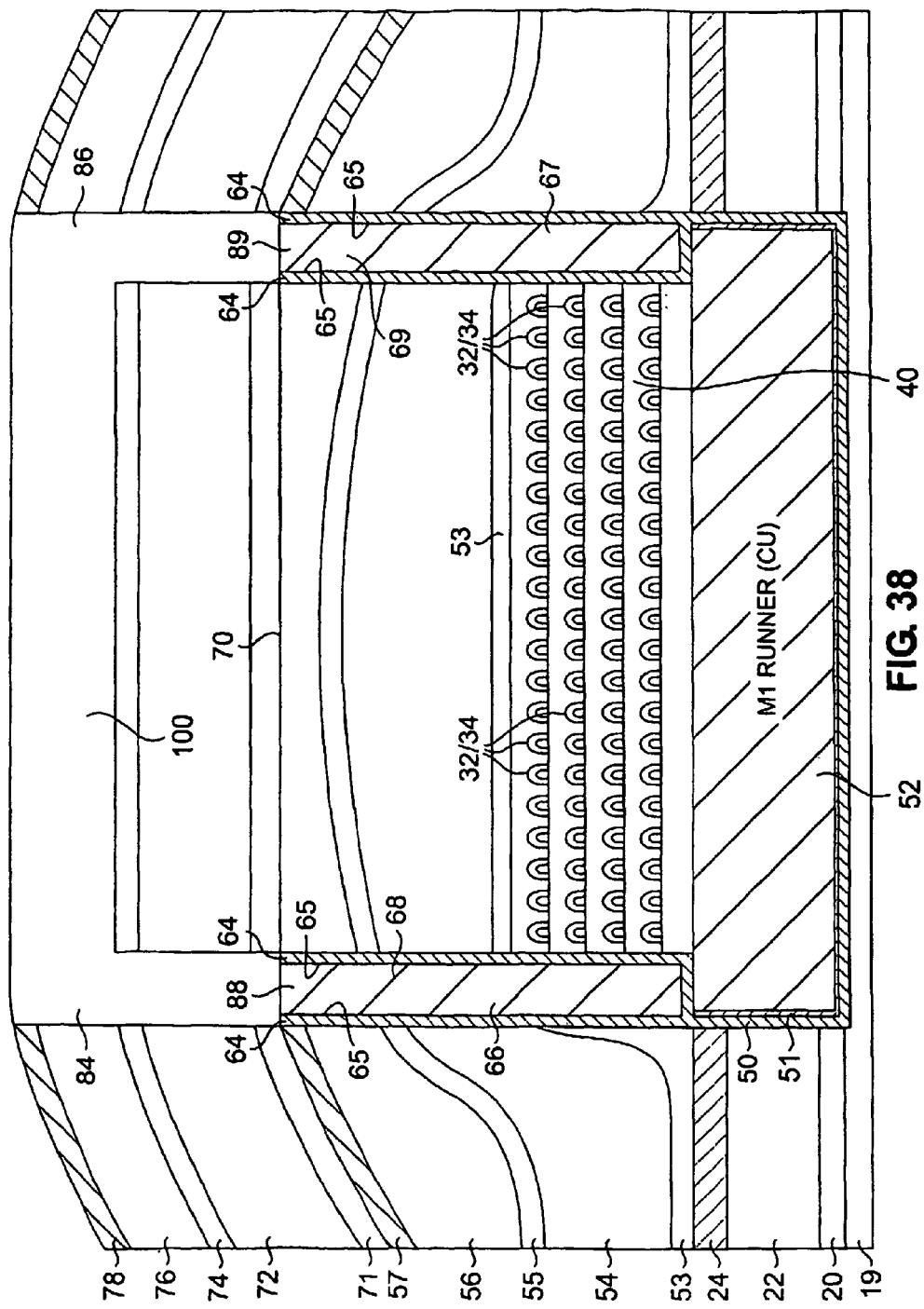

A trench 100 extending downwardly to the etch stop layer 74 is formed in the stack of layers as illustrated in FIG. 38. It is known that to effectively stop the etch process at the etch stop layer 74 the etch byproducts are analyzed. When the material of the etch stop layer 74 is detected the etch process is terminated.

Figure 39:
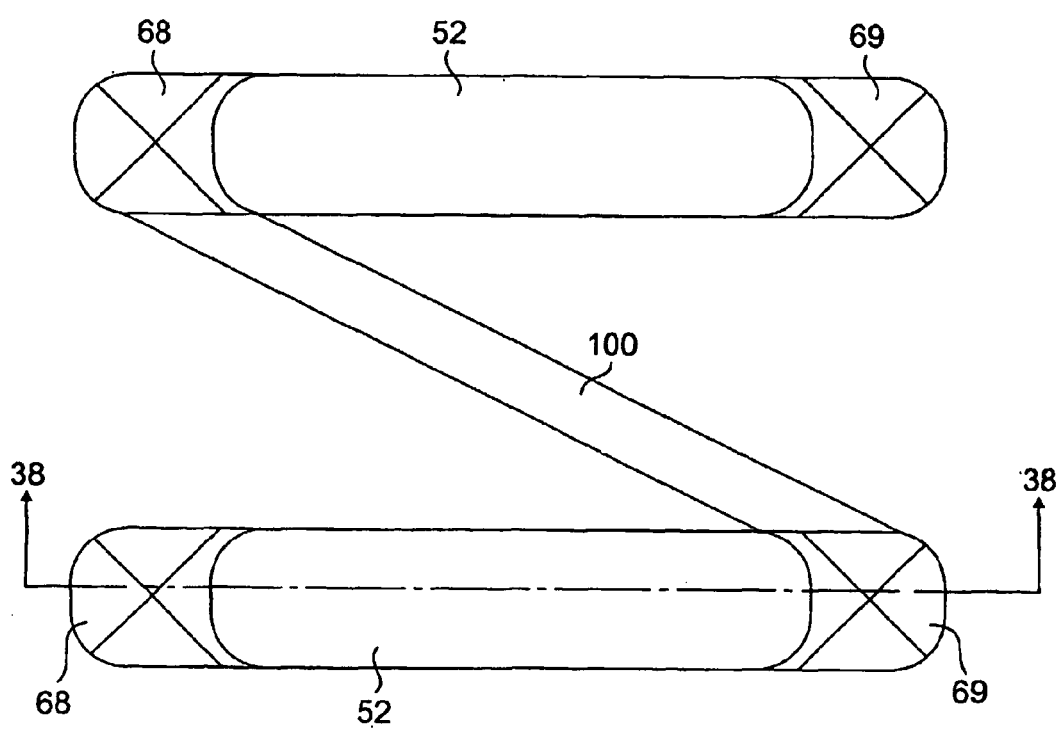

The orientation of the trench 100 with respect to successive metal-1 runners 52 and metal-2 conductive vias 68 and 69 is shown in the top view of FIG. 39, with FIG. 38 illustrating a cross-section view along the line 38/38 of FIG. 39. Thus it will be seen that the conductive material formed later in the trench 100, as described below, interconnects two successive metal-1 runners 52 through the conductive vias 68/66 (left side) and 69/67 (right side). The orientation of the core 40 relative to the metal-1 runners 52 is illustrated in two embodiments: the embodiment of FIG. 29 wherein the metal-1 runners 52 (formed in the trench 42) surround core segments 40A-40F; the embodiment of FIG. 30 wherein a metal-1 runner is disposed between each core segment 40A-40F.

Figure 40:
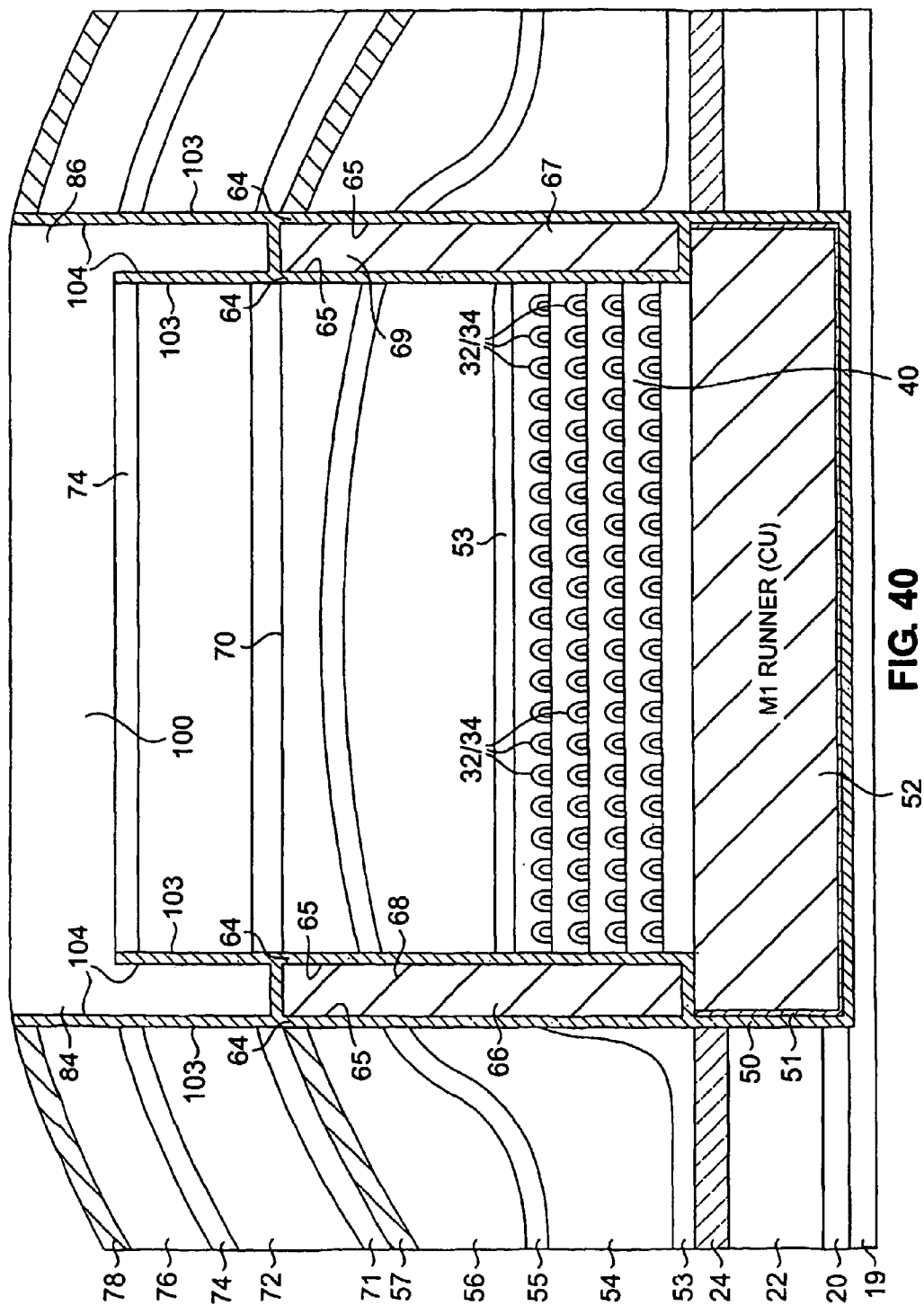

As shown in FIG. 40, a barrier layer 103 is deposited to limit the diffusion of the copper (later formed in the trench 100) into the surrounding insulating layers. The material of the barrier layer 103 (tantalum, tantalum-nitride, titanium and titanium-nitride are candidate materials) is sputtered along the side walls and bottom of the via openings 84 and 86. Next a thin copper seed layer 104 is deposited, preferably by sputtering, to serve as a starting layer for the subsequent copper electroplating. Alternatively, the barrier layer 103 and the seed layer 104 may be deposited by conventional chemical vapor deposition or electroplating processes. It is not necessary to form a barrier layer along the bottom surface of the trench 100, as the etch stop layer 74 serves the barrier purpose. Also the plating seed layer is not required on the bottom surface of the trench 100 because copper will electroplate laterally from the side walls of the via openings 84 and 86.

Figure 41:
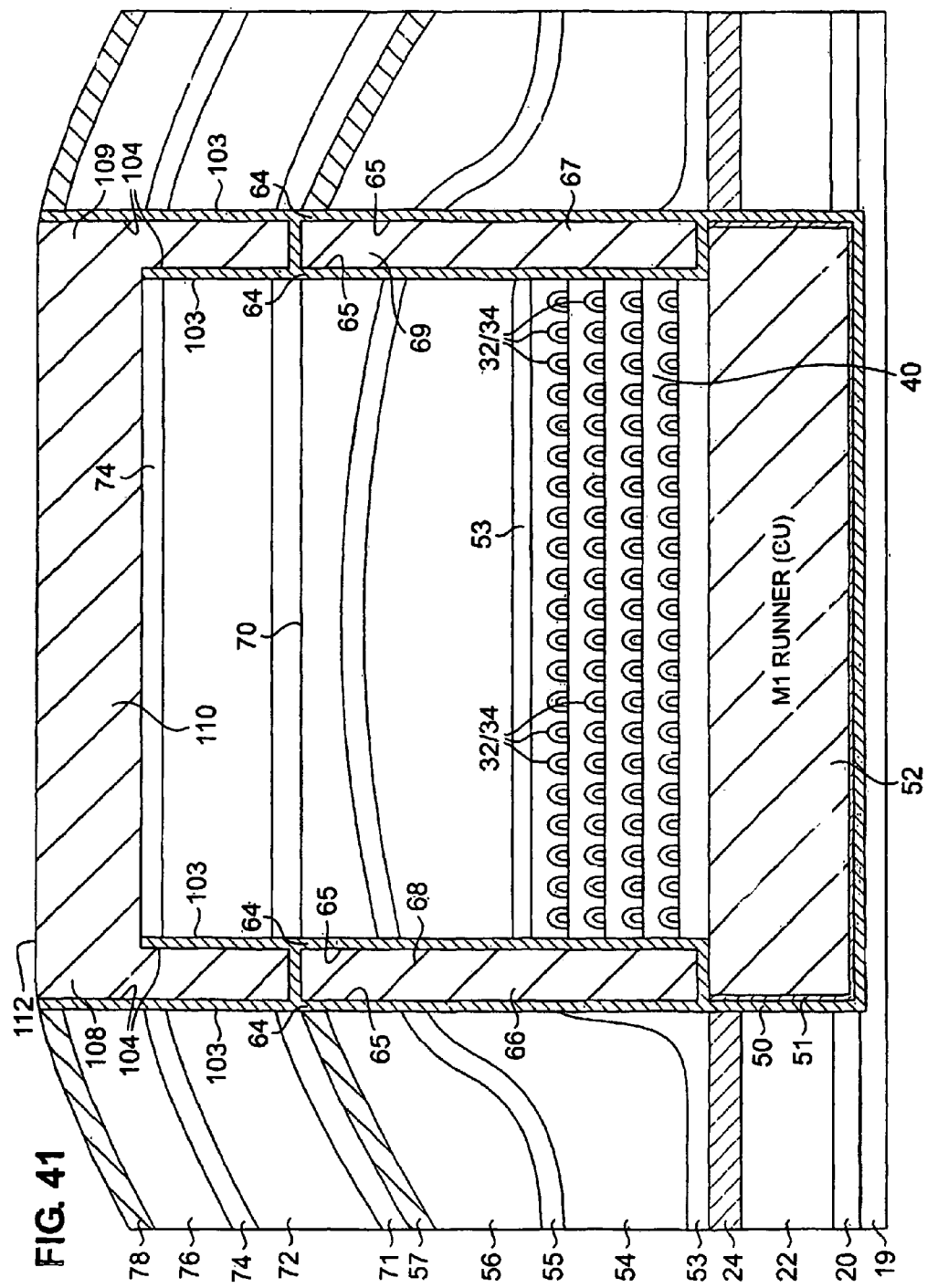

Copper is deposited, preferably by electroplating, filling the via openings 84 and 86 to form conductive vias 106 and 107, metal-3 vias 108 and 109 and a metal-3 runner 110 therebetween. See FIG. 41. The structure is then chemically-mechanically polished to remove copper from the unwanted field areas of the substrate and planarize a top surface 112.

Figure 42:
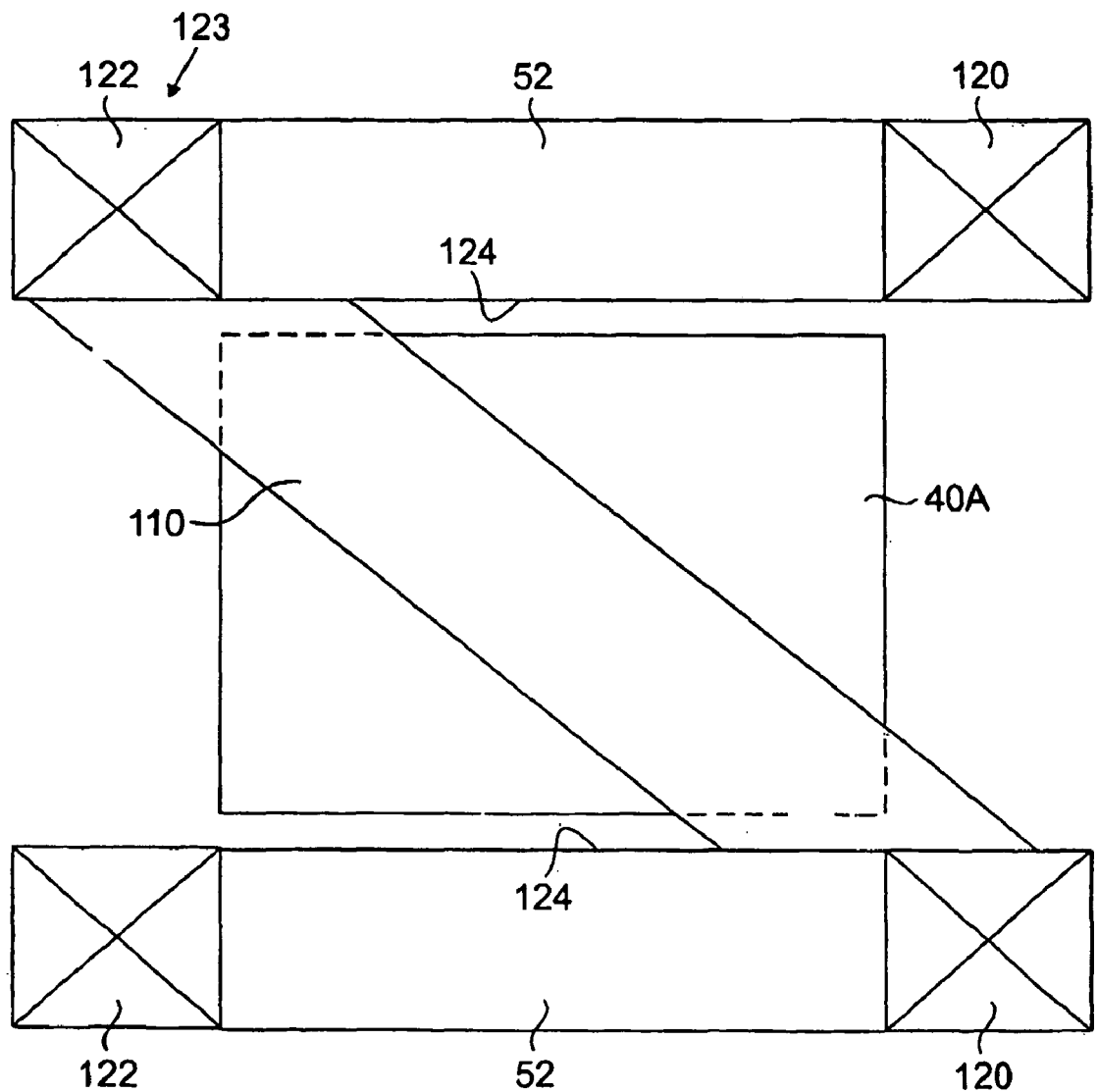
FIGS. 42 through 44 illustrate top views of alternative inductor structures formed according to the teachings of the present invention.

The metal-3 runner 110 interconnects two consecutive parallel metal-1 runners 52, as shown in the top view of FIG. 42, resulting in a helical conductor structure. In this embodiment, the inductor core segments 40A-40F are disposed between successive metal-1 runners 52 and below the metal-3 runner 110. Only one core segment 40A is illustrated in FIG. 42. In the embodiment illustrated, the metal-1 runner 52 is substantially rectangular with diagonal interconnecting metal-3 runners 110, resembling the letter "Z" in the top view. The metal-3 runner 110 interconnects successive metal-1 runners 52 via a vertical conductive stack 120 (comprising the conductive via 67, the metal-2 via layer 69, the conductive via 107 and the metal-3 via layer 109) and the vertical conductive stack 122 (comprising the conductive via 66, the metal-2 via layer 68, the conductive via 106 and the metal-3 via layer 108), to form an inductor winding 123. Additional windings similar to and electrically connected to the winding 123 are juxtaposed to form an inductor having a core comprising Ge/CoSi2 quantum dots.

Figure 43:
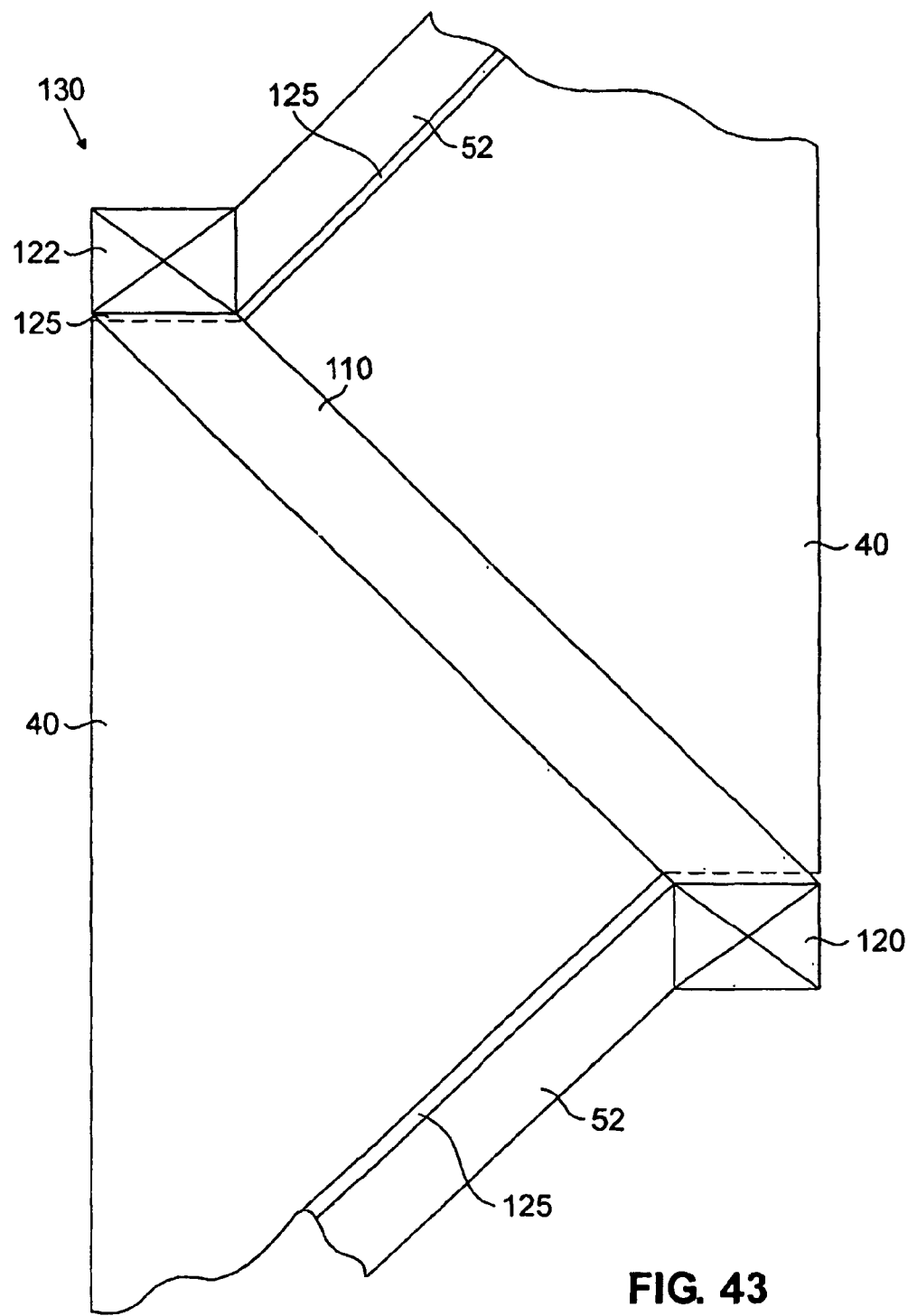

In yet another embodiment, illustrated in FIG. 43, the metal-1 and metal-3 runners 52 and 110 are interconnected in a zig-zag pattern to form an inductor winding 130.

Figure 44:
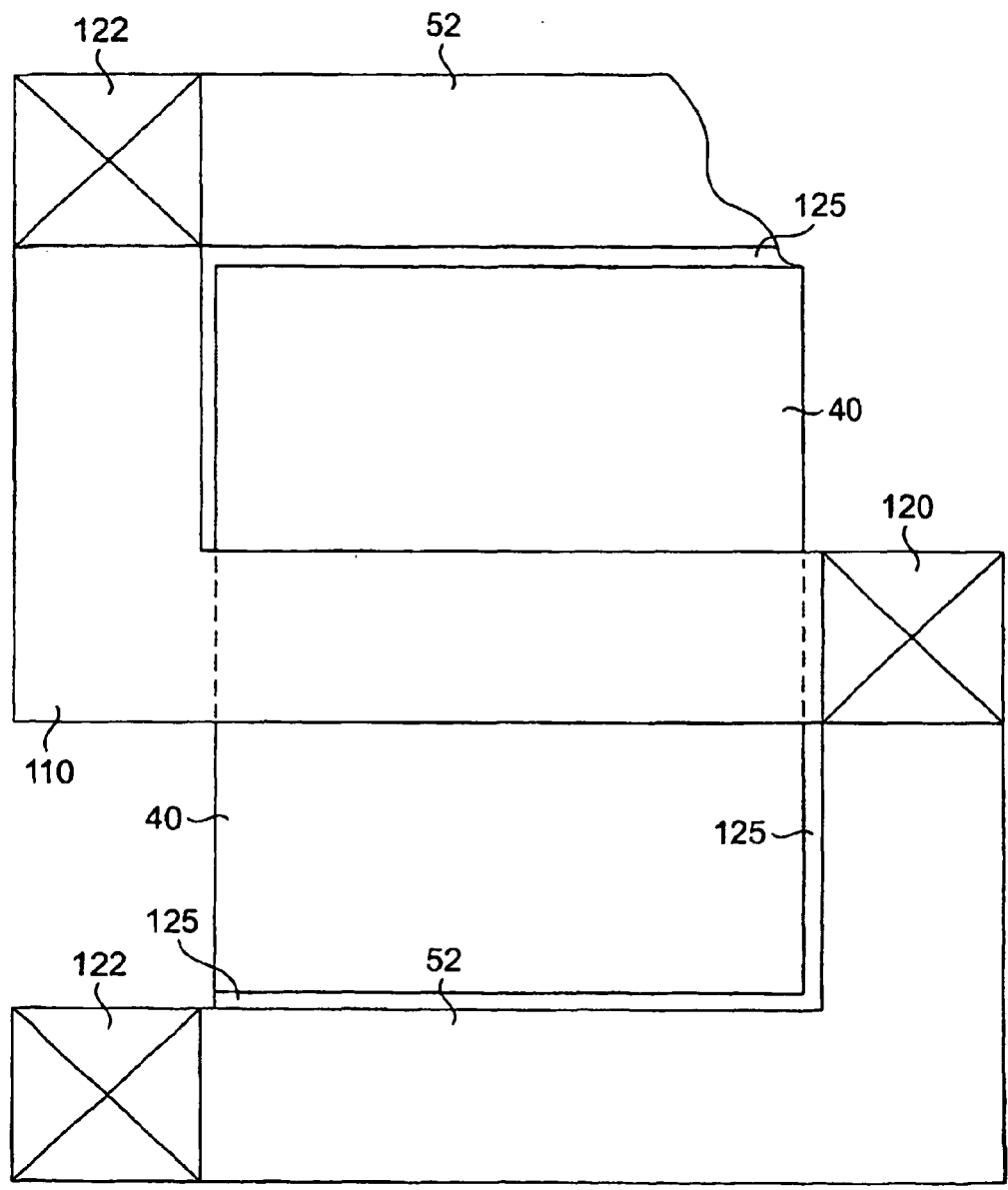

In the embodiment illustrated in the top view of FIG. 44, the metal-1 runners 52 and the metal-3 runners 110 are both substantially L-shaped and interconnected at a first end by the vertical conductive stack 120, comprising the conductive via 67, the metal-2 via layer 69, the conductive via 107 and the metal-3 via layer 109. At a second end the metal-3 runner 110 is electrically connected to the next successive metal-1 runner 52 via the vertical conductive stack 122, comprising the conductive via 66, the metal-2 via layer 68, the conductive via 106 and the metal-3 via layer 108. The inductor core segment 40A is disposed between the metal-1 runners 52 and below the metal-3 runner 110. A plurality of the FIG. 44 windings are juxtaposed and electrically connected to form an inductor comprising a plurality of windings and core segments.

Although the Figures and accompanying description herein illustrate placement of the bottom and top metal layers of the inductor in the metal-1 and metal-3 layers of the integrated circuit, the inventive features of the present invention can be applied such that the inductor spans other metal layers, for example, the bottom segment of an inductor winding can be placed within the metal-2 layer and the top segment of the winding can be placed within the metal-4 layer or the metal-5 layer. Other embodiments where different metal layers and a different number of metal layers are spanned are considered within the scope of the present invention.

Although formation of the inductor according to the present invention has been described using a damascene process, the invention is not limited thereto. The inductor windings can also be formed using conventional metal deposition and subtractive etch steps wherein the metal layers forming the top and bottom winding segments are interconnected by vertical vias spanning the metal layers. Further details of the process for forming the inductor windings can be found in the commonly-assigned patent application entitled A Multi-Layer Inductor Formed in a Semiconductor Substrate, filed on Oct. 5, 2001, and bearing application Ser. No. 09/972,482.

Figure 5:
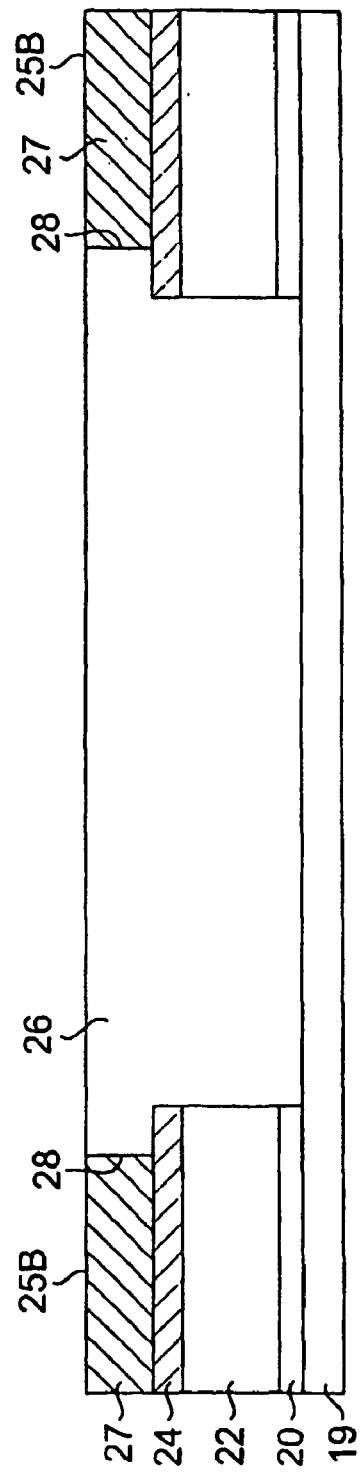
Figure 45:
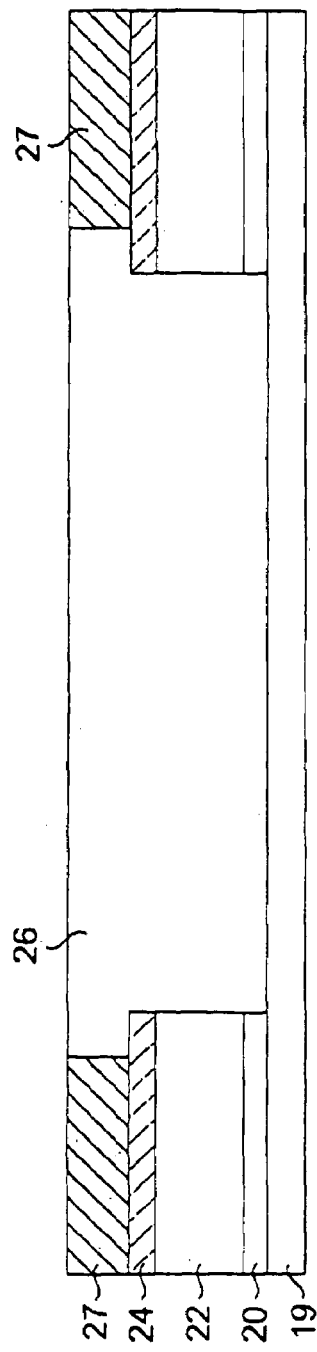
FIGS. 45 through 48 illustrate sequential fabrication steps of an inductor structure according to another fabrication embodiment of the present invention.
Figure 46:
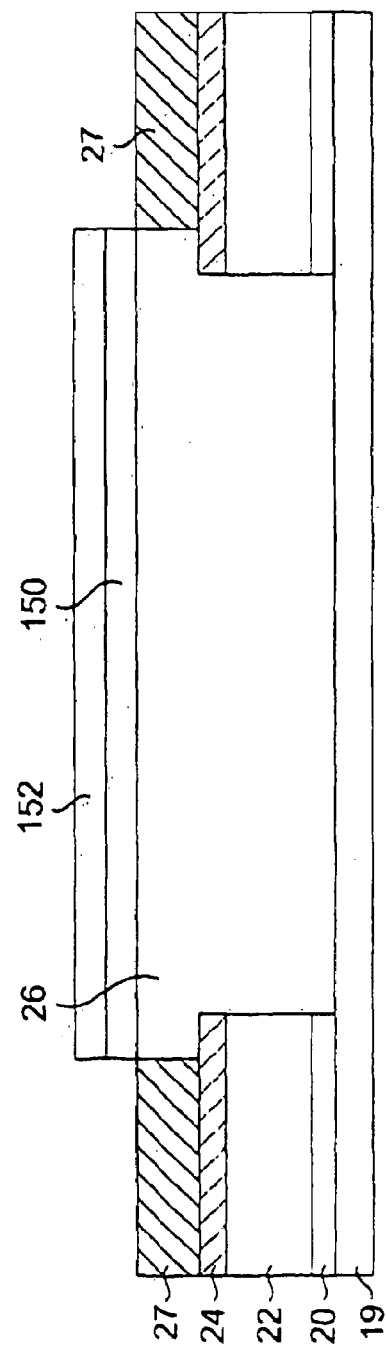

Another process for forming a ferromagnetic core begins with the structure illustrated in FIG. 45, which is identical to the structure of FIG. 5, including the silicon buffer 26. All areas, except the growth surface of the silicon buffer 26, are masked with photoresist 27 to prevent processing in the masked regions. As shown in FIG. 46, an $SiO_2$ layer 150 about 1 nm thick is deposited or grown over the silicon buffer layer 26. Next a layer 152 comprising 1–5 monolayers of cobalt (or another ferromagnetic material) is deposited over the $SiO_2$ layer 150.

Figure 47:
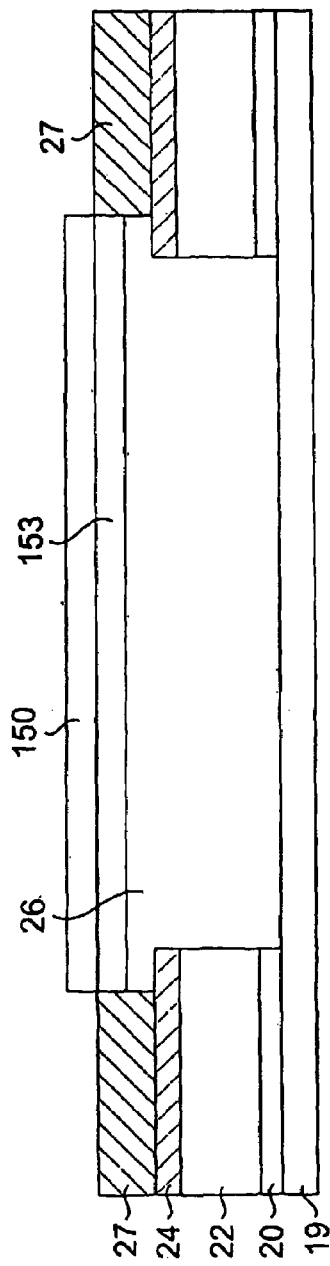

The structure is annealed at about 375–425° C., to diffuse the cobalt through the $SiO_2$ layer 150 and into the silicon buffer 26, where it reacts with the silicon to form a layer of CoSi2 153, primarily at the SiO2/silicon interface. See FIG. 47. This process of cobalt reacting with silicon to form cobalt-silicide is known in the art. (See R Hibino and T. Ogino, Appl. Phys. Lett. Vol. 67 no. 7 1995, pp. 915–917). After formation of the CoSi2 layer 153, the SiO2 layer 150 can be removed.

Figure 48:
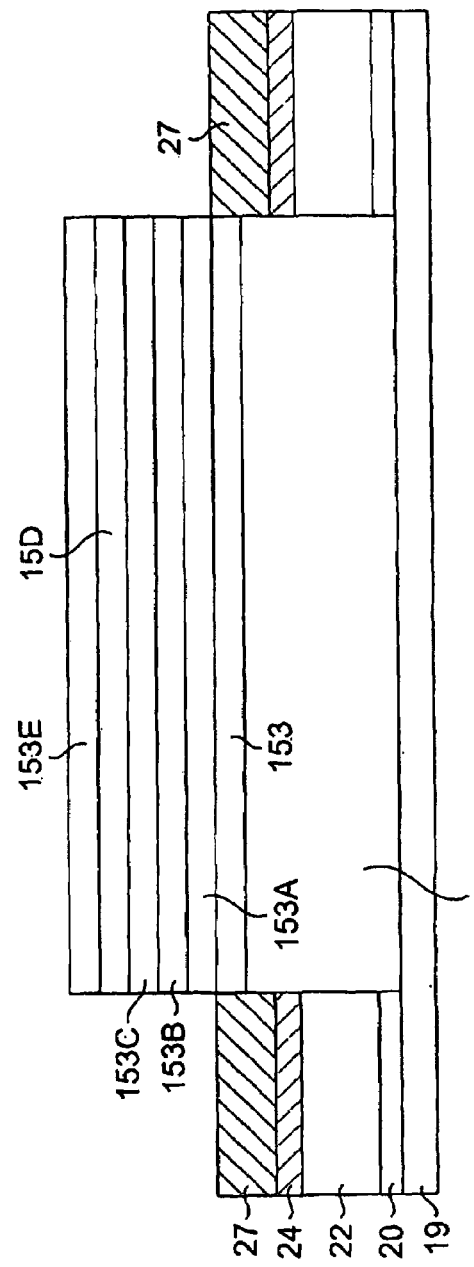

If a multilayer inductor core is to be formed, the process continues by repeatedly forming an epitaxial layer of silicon on the surface of the silicon dioxide layer 150, followed by formation of a cobalt layer. The structure is annealed to form another layer of cobalt-silicide in the epitaxial silicon layer. An inductor core 154 formed according to this process and comprising a plurality of cobalt-silicide layers 153, 153A, 153B, 153C, 153D and 153E is illustrated in FIG. 48. Side walls 155 of the inductor core 154 can be vertically aligned with the side walls 28 of the silicon buffer layer 26 by masking, patterning and etching steps. The photoresist 27 can be removed and the process continues with the formation of the conductive runners and vias, in accordance with the process steps illustrated in FIGS. 25 through 44, wherein the inductor core 154 replaces the inductor core 40 of the previously described embodiment.

In another embodiment, beginning with the structure of FIG. 49, another process for forming a ferromagnetic core is illustrated. With all the regions except the silicon buffer growth surface region 26 masked with photoresist 27, a SiO2 layer 160 (about 100 mm thick) is deposited or grown over the silicon buffer 26. Next a silicon layer 162 (e.g., polysilicon or amorphous silicon) about 100 nm thick is formed over the SiO2 layer 160 to serve as a buried oxide layer. The thickness of the silicon layer 162 is chosen to provide a sufficient barrier to block subsequently implanted metal ions from reaching the SiO2 layer 160. Hydrogen is implanted into the structure (as represented by arrowheads 164) with sufficient energy and dose so that most of the hydrogen atoms are driven into the silicon buffer 26. Helium or any other material capable of forming nano-cavities as discussed below, can be used in lieu of hydrogen. After a local thermal anneal, such as a laser anneal (which advantageously avoids heating the entire structure to a temperature that can change the dopant profiles and impair the metalized interconnects, but permits the implanted hydrogen impurities to diffuse), a layer comprising nano-cavities 166 (with each cavity about 10 to 130 nm in diameter) is formed in an upper region of the silicon buffer 26. See FIG. 50.

Figure 51:
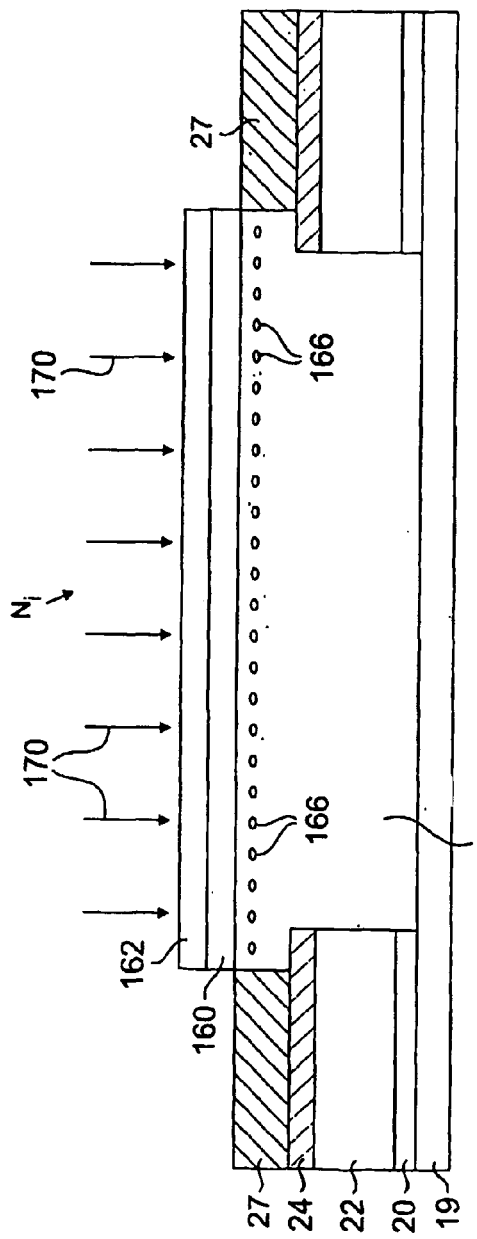
Figure 52:
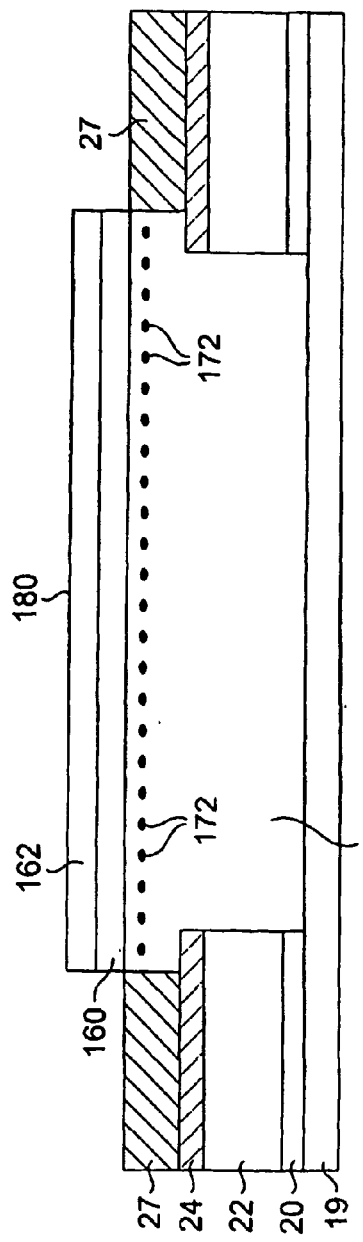

As shown in FIG. 51, nickel, cobalt, iron, gadolinium or another ferromagnetic metal is then implanted, as represented by arrowheads 170, with a sufficient dose level and implant energy to drive the ions into the silicon layer 162 but not into the SiO2 layer 160. The ferromagnetic material is diffused downwardly through the silicon dioxide layer 160 such that it precipitates into the nano-cavities 166 to create a band of ferromagnetic domains 172, thereby forming an inductor core 180. See FIG. 52. During this process, the increased surface area and defects of the nano-cavities 166 within the silicon layer 26 cause the nano-cavities 166 to serve as sinks for silicon self-interstitials, which in turn lowers the nucleation barrier for the ferromagnetic material to precipitate into the nano-cavities. Additional successive layers of silicon dioxide and silicon can be formed over the silicon layer 162 to form additional layers of nano-cavities 172 in the silicon layers. Ferromagnetic materials are implanted, as in FIG. 51, and precipitate to the silicon layer forming additional layers of nano-cavities 172 as in FIG. 52.

Figure 53:
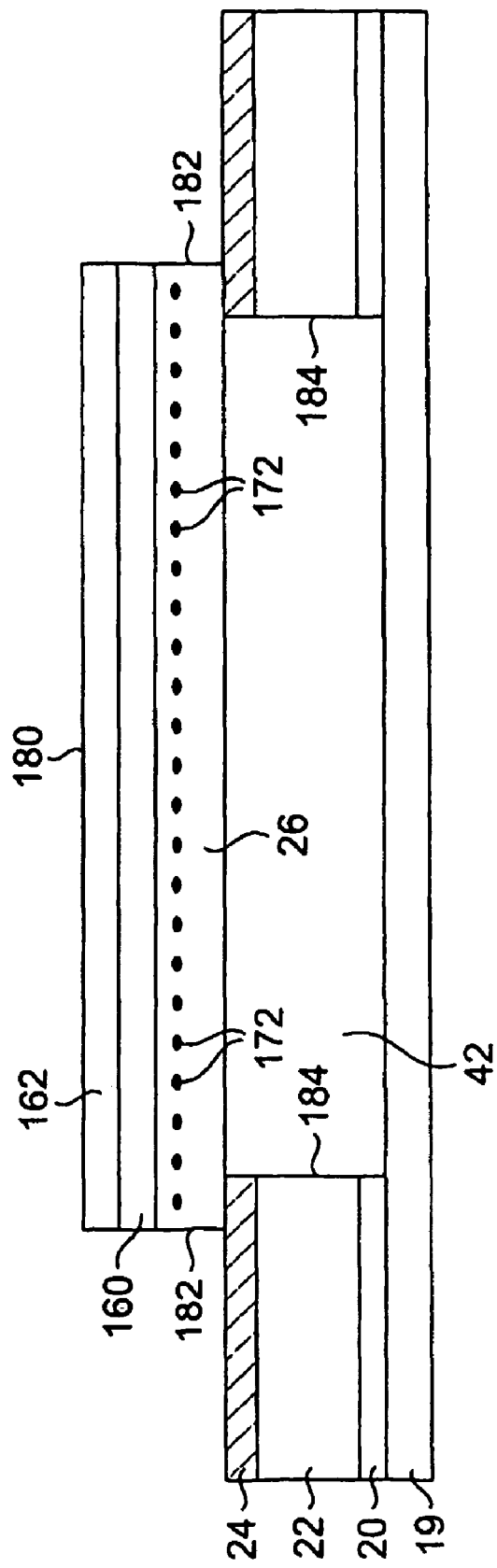

The silicon layer 162 and the SiO2 layer 160 can be removed by etching if necessary. The structure can then be masked and etched to remove the photoresist 27 and align side walls 182 of the silicon buffer 26 with the edges 184 of the trench 42, as shown in FIG. 53. Formation of the remaining inductor structures continues with the process steps described in conjunction with FIGS. 25 through 44, with the inductor core 180 replacing the inductor core 40.

Advantageously, the multilayer inductor, including the various core embodiments, formed according to the teachings of the present invention is fabricated within the conventional metal layers of an integrated circuit (with the inductor formed as a helical conductor structure). The fabrication processes are compatible with conventional CMOS backend (i.e., interconnect) processing and the resulting structure offers a higher Q and lower resistance in a relatively compact area than prior art inductors formed within an integrated circuit structure. When the conductive structures are formed of copper, the resulting conductor has a lower resistance than those formed with aluminum, and thus the inductor exhibits a still higher Q. A larger inductor cross-sectional area results in those embodiments employing metal layers at spaced apart levels of the substrate (for example, metal-1 to metal-3 or metal-3 to metal-5), which results in a higher inductance value. As illustrated by the processing steps discussed above, the inductor is highly integratable either on-chip with other active elements or as part of a multi-module device constructed on a common substrate. The use of a relatively small volume of conductive material in the inductor conductor structure lowers the eddy current losses when compared with prior art inductors. Also, the magnetic circuit lines are more concentrated due to the compact inductor structure. Thus the inductance is increased and the effect on proximate regions of the integrated circuit is reduced.

The present invention can also be applied to form a transformer, comprising two interacting windings where the magnetic field lines of one winding (the primary winding) cut across the windings of the second winding and induce a voltage therein (the secondary winding). Incorporation of the aforedescribed ferromagnetic core material in the transformer increases the winding inductance. Details of a transformer to which the teachings of the present invention can be applied can be found in commonly-assigned patent application entitled, A Thin Film Multilayer High Q Transformer formed in a Semiconductor Substrate, filed on Oct. 5, 2001, and assigned application Ser. No. 09/972,481, which is hereby incorporated by reference.

An architecture and process have been described as useful for forming a ferromagnetic core for a multilayer high Q inductor on a semiconductor substrate. While specific applications of the invention have been illustrated, the principals disclosed herein provide a basis for practicing the invention in a variety of ways and in a variety of circuit structures. Numerous variations are possible within the scope of the invention, including the use of any two metal layers to form the inductor conductors. The invention is limited only by the claims that follow.

What is claimed is:

1. A method for forming an integrated circuit structure comprising:
   providing a semiconductor substrate having an upper surface;
   forming a first plurality of conductive lines in a first layer overlying the upper surface;
   forming a second plurality of conductive lines in a second layer spaced apart from and overlying the first layer;
   interconnecting the first and the second plurality of conductive lines to form a helical conductor structure; and
   forming semiconductor material islands exhibiting ferromagnetic properties between the first and the second layers wherein the step of forming semiconductor material islands further comprises:
   (a) forming a silicon layer between the two interconnected conductor layers, wherein the silicon layer has a top surface;
   (b) forming a semiconductor material layer on the top surface; and
   (c) forming the semiconductor material islands from the semiconductor material layer; and
   Wherein the step (c) further comprises annealing the integrated circuit structure to form the semiconductor material islands, and wherein the duration and temperature characteristics of the annealing step affect the density and spacing of the semiconductor material islands.

2. The method of claim 1 further comprising forming a plurality of conductive vias connecting terminal ends of each one of the second plurality of conductive lines to terminal ends of two successive conductive lines of the first plurality of conductive lines, such that one of the second plurality of conductive lines conductively spans two successive conductive lines of the first plurality of conductive lines to form the helical conductor structure.

3. The method of claim I wherein the step of forming the material layer comprises forming a crystalline material layer with spaced apart ferromagnetic elements incorporated therein.

4. The method of claim 1 wherein the step (b) further comprises forming a germanium layer having a thickness of about five to thirty angstroms.

5. The method of claim 1 wherein the steps (a) through (c) are repeated to form a plurality of layers each comprising semiconductor material islands.

6. A method for forming an integrated circuit structure comprising:
   (a) providing a semiconductor substrate having an upper surface;
   (b) forming a first plurality of substantially parallel conductive strips in a first plane substantially parallel to the upper surface;
   (c) forming a second plurality of conductive strips in a second plane substantially parallel to the first plane;
   (d) interconnecting terminal ends of each one of the second plurality of conductive strips to terminal ends of two successive conductive strips of the first plurality of conductive strips, such that one of the second plurality of conductive strips conductively spans two successive conductive strips of the first plurality of conductive strips; and
   (e) forming a layer of laterally spaced-apart and discrete semiconductor material regions between the first and the second planes, the material regions exhibiting ferromagnetic properties.

7. The method of claim 6 wherein the step of forming the semiconductor material regions further comprises forming a semiconductor layer, forming quantum dots within the semiconductor layer, forming a layer of ferromagnetic material over the quantum dots, wherein the ferromagnetic material is selected from among cobalt, iron, nickel and gadolinium and annealing the integrated circuit structure to form ferromagnetic material from the ferromagnetic layer in the quantum dots.

8. The method of claim 6 wherein the steps (e) through (e) are repeated to form a plurality of material region layers.

9. A method for forming an integrated circuit structure comprising:
   (a) providing a semiconductor substrate having an upper surface;
   (b) forming a first plurality of substantially parallel conductive strips in a first plane substantially parallel to the upper surface;
   (c) forming a second plurality of conductive strips in a second plane substantially parallel to the first plane;
   (d) interconnecting terminal ends of each one of the second plurality of conductive strips to terminal ends of two successive conductive strips of the first plurality of conductive strips, such that one of the second plurality of conductive strips conductively spans two successive conductive strips of the first plurality of conductive strips;

(e) forming a first silicon layer between the first and the second planes;

(f) forming a plurality of nano-cavities in the first silicon layer; and forming ferromagnetic material in the plurality of nano-cavities.

10. The method of claim 9 wherein the step (f) further comprises:

(f1) forming a silicon dioxide layer overlying the first silicon layer;

(f2) forming a second silicon layer overlying the silicon dioxide layer;

(f3) implanting nano-cavity forming ions wherein the implant energy is selected to drive substantially all of the ions into the first silicon layer;

(f4) annealing the integrated circuit structure causing the formation of a plurality of nano-cavities in the first silicon layer.

11. The method of claim 10 wherein the step (g) further comprises implanting a ferromagnetic material having an implant energy selected to drive the ferromagnetic material into the second silicon layer and annealing the integrated circuit structure to precipitate the ferromagnetic material into the plurality of nano-cavities.

12. The method of claim 10 wherein the step (f1) comprises forming a silicon dioxide layer having a thickness of about 100 nanometers.

13. The method of claim 10 wherein the step (f2) comprises forming a second silicon layer having a thickness of about 100 nanometers.

14. The method of claim 9 wherein the ferromagnetic material is selected from among nickel, iron, cobalt and gadolinium.

15. The method of claim 9 wherein the steps (e) and (g) are repeated to form a plurality of ferromagnetic material layers.

16. A method for forming an integrated circuit structure comprising:

providing a semiconductor substrate having an upper surface;

forming a first plurality of substantially parallel conductive strips in a first plane substantially parallel to the upper surface;

forming a second plurality of conductive strips in a second plane substantially parallel to the first plane;

interconnecting terminal ends of each one of the second plurality of conductive strips to terminal ends of two successive conductive strips of the first plurality of conductive strips, such that one of the second plurality of conductive strips conductively spans two successive conductive strips of the first plurality of conductive strips;

forming a silicon layer between the first and the second planes, wherein the silicon layer has a top surface;

forming a semiconductor material layer on the top surface; and forming a plurality of semiconductor quantum dots from the semiconductor material layer; and forming ferromagnetic material in the quantum dots.

17. The method of claim 16 wherein the step of forming the plurality of semiconductor quantum dots further comprises annealing the structure.

18. A method for forming, within a semiconductor substrate, an inductor having a core exhibiting ferromagnetic properties, comprising: providing a semiconductor substrate;

forming a first stack of insulating layers over the semiconductor substrate;

forming a plurality of substantially parallel first trenches within one or more layers of the first stack of insulating layers;

forming conductive material within each one of the plurality of first trenches to form a plurality of substantially parallel first level metal runners;

forming laterally spaced-apart and discrete semiconductor material regions exhibiting ferromagnetic properties within or overlying the plane of the plurality of first level metal runners;

forming a second stack of insulating layers overlying the first stack of insulating layers;

forming a plurality of first and second conductive vias within the second stack of insulating layers, wherein a bottom surface of each one of the plurality of first and second conductive vias is in electrical contact with a first end and a second end, respectively, of each one of the plurality of first level metal runners;

forming a third stack of insulating layers overlying the second stack of insulating layers;

forming a plurality of third and fourth via openings within the third stack of insulating layers, wherein each one of the plurality of third and fourth via openings is vertically aligned with one of the plurality of first and second conductive vias, respectively;

forming a plurality of substantially parallel second trenches within one or more layers of the third stack of insulating layers, wherein a first end and a second end of each one of the plurality of second trenches is aligned with one of the plurality of third via openings and fourth via openings, respectively, and wherein each one of the plurality of second trenches is disposed between two successive first metal level runners;

forming conductive material within the plurality of third and fourth via openings and the plurality of second trenches to form a plurality of third and fourth conductive vias and a plurality of second level metal runners in electrical contact therewith, wherein each one of the plurality of third and the fourth conductive vias is in electrical contact with one of the first and the second plurality of conductive vias, respectively, and wherein one of the plurality of second level metal runners conductively spans two successive first level metal runners.

19. The method of claim 18 wherein the step of forming the material regions exhibiting ferromagnetic properties further comprises:

forming a silicon layer within or overlying the plane of the plurality of first level metal runners, wherein the silicon layer has a top surface;

forming a silicon dioxide layer on the top surface;

forming a semiconductor material layer overlying the silicon dioxide layer:

forming quantum dots from the semiconductor material layer:

forming a layer of ferromagnetic material over the quantum dots; and annealing the integrated circuit structure to form the ferromagnetic material in the quantum dots.

20. The method of claim 18 wherein the step of forming the material regions exhibiting ferromagnetic properties further comprises:
   forming a first silicon layer within or overlying the plane of the plurality of first level metal runners;
   forming a plurality of nano-cavities in the first silicon layer; and
   forming ferromagnetic material in the plurality of nano-cavities.

21. The method of claim 18 wherein the step of forming the material regions exhibiting ferromagnetic properties further comprises:
   forming a silicon layer within or overlying the plane of the plurality of first level metal runners, wherein the silicon layer has a top surface;
   forming a semiconductor material layer on the top surface; and
   forming a plurality of semiconductor islands on the top surface, wherein the plurality of semiconductor islands exhibit ferromagnetic properties.

22. A method for forming an integrated circuit structure comprising an inner winding, a core, and an outer winding, wherein the method comprises:
   forming a semiconductor substrate having an upper surface therein;
   forming an outer winding comprising:
      forming spaced apart first upper and first lower conductor lines over the upper surface;
      interconnecting the first upper and the first lower conductor lines to form a first helical conductor structure;
   forming an inner winding comprising:
      forming a second upper and a second lower conductor lines between the first upper and the first lower conductor lines;
      interconnecting the second upper and the second lower conductor lines to form a second helical conductor structure about and approximately concentric with the first helical conductor structure; and
      forming laterally spaced-apart semiconductor material regions exhibiting ferromagnetic properties within the second helical conductor structure.

23. The method of claim 22 wherein the step of forming the semiconductor material regions exhibiting ferromagnetic properties further comprises:
   forming a silicon layer within the second helical structure;
   forming a silicon dioxide layer over the silicon layer;
   forming a semiconductor material layer overlying the silicon dioxide layer:
   forming quantum dots from the semiconductor material layer:
   forming a ferromagnetic material layer over the quantum dots: and
   annealing the integrated circuit structure to form the ferromagnetic material in the quantum dots.

24. The method of claim 22 wherein the step of forming the semiconductor material regions exhibiting ferromagnetic properties further comprises:
   forming a first silicon layer within the second helical structure;
   forming a plurality of nano-cavities in the first silicon layer; and
   forming ferromagnetic material in the plurality of nano-cavities.

25. The method of claim 22 wherein the step of forming the semiconductor material regions exhibiting ferromagnetic properties further comprises:
   forming a silicon layer having a top surface within the second helical structure;
   forming a semiconductor material layer on the top surface; and
   forming a plurality of semiconductor islands on the top surface, wherein the plurality of semiconductor islands exhibit ferromagnetic properties.

26. An integrated circuit structure, comprising:
   a semiconductor substrate;
   a helical conductor formed over the substrate; and
   a core comprising laterally spaced-apart discrete semiconductor material regions exhibiting ferromagnetic effects formed in a region bounded by the helical conductor.

27. The integrated circuit structure of claim 26 wherein an axis of the helical structure is substantially parallel to an upper surface of the semiconductor substrate.

28. The integrated circuit structure of claim 26 wherein the core comprises a plurality of substantially parallel material layers each layer comprising the laterally spaced-apart discrete material regions exhibiting ferromagnetic effects.

29. The integrated circuit structure of claim 26 wherein the discrete material regions comprises quantum dots formed in one or more semiconductor land ferromagnetic material encapsulated within the quantum dots.

30. The integrated circuit structure of claim 29 wherein the ferromagnetic material is selected from among cobalt, iron, nickel and gadolinium.

31. The integrated circuit structure of claim 26 wherein the discrete material regions comprise semiconductor material islands.

32. The integrated circuit structure of claim 26 wherein the discrete material regions comprises nanocavities formed in a silicon layer and ferromagnetic material formed within the nanocavities.

33. The integrated circuit structure of claim 32 wherein the ferromagnetic material is selected from among cobalt, iron, nickel and gadolinium.

34. The integrated circuit structure of claim 26 wherein the helical conductor comprises a plurality of concentric connected windings, and wherein each winding is in the shape of a rectangle.

35. The integrated circuit structure of claim 34 wherein each one of the plurality of windings comprises:
   a first lower conductive strip overlying the semiconductor substrate;
   a first conductive via having a lower surface connected to a first terminal end of the lower conductive strip;
   a upper conductive strip spaced apart from the lower conductive strip and having a first terminal end connected to an upper surface of the first conductive via;
   a second conductive via having an upper surface connected to a second terminal end of the second conductive strip, wherein a lower surface of the second conductive via is connected to a first terminal end of a second lower conductive strip forming a portion of the next winding of the helical conductor.

36. The integrated circuit structure of claim 35, wherein the core comprises a plurality of core segments, and wherein one of the plurality of core segments is positioned between the first and the second lower conductive strips.

37. The integrated circuit structure of claim 35, wherein the core comprises a plurality of core segments, and wherein a lower conductive strip substantially surrounds a core segment.

38. An integrated circuit structure comprising:
a semiconductor substrate;
a plurality of substantially parallel first conductive strips overlying the semiconductor substrate;
a first stack of conductive vias in electrical connection with a first end of each one of the plurality of first conductive strips;
a second stack of conductive vias in electrical connection with a second end of each one of the plurality of first conductive strips;
a plurality of second conductive strips having a first end in electrical connection with the uppermost via of the first stack of conductive vias and a second end in electrical connection with the uppermost via of the second stack of conductive vias, wherein one of the plurality of second conductive strips conductive spans two successive first conductive strips; and
a core comprising laterally spaced-apart discrete semiconductor material regions exhibiting ferromagnetic properties disposed between the first and the second conductive strips for increasing the inductance of the integrated circuit structure.

39. The integrated circuit structure of claim 38 wherein the discrete material regions comprises having a plurality of quantum dots, and wherein ferromagnetic material is encapsulated within the quantum dots.

40. The integrated circuit structure of claim 39 wherein the ferromagnetic material is selected from among cobalt, iron, nickel and gadolinium.

41. The integrated circuit structure of claim 38 wherein the discrete material regions comprises a silicon layer having a plurality of nanocavities therein, and wherein ferromagnetic material is disposed within the nanocavitles.

42. The integrated circuit structure of claim 41 wherein the ferromagnetic material is selected from among cobalt, iron, nickel and gadolinium.

43. The integrated circuit structure of claim 38 wherein the discrete material regions comprise semiconductor material islands.

44. The integrated circuit structure of claim 43 wherein the ferromagnetic material is selected from among cobalt, iron, nickel and gadolinium.

45. The integrated circuit structure of claim 38 wherein the core material comprises a plurality of stacked material layers each layer comprising the discrete material regions exhibiting ferromagnetic properties.

46. A multi-level integrated circuit structure, comprising:
a semiconductor substrate having a plurality of insulating layers and a plurality of conductive layers therebetween;
runner conductive portions;
vertical conductive portions;
wherein lower runner portions are formed in a lower conductive layer of the semiconductor substrate;
wherein upper runner portions are formed in an upper conductive layer above the lower runner portions;
wherein two or more vertically aligned first via portions effect electrical connection between a first end of a first lower runner portion and an overlying first end of a first upper runner portion;
wherein two or more vertically aligned second via portions effect electrical connection between a first end of a second lower runner portion and an overlying second end of the first upper runner portion; and
a material layer comprising laterally spaced-apart discrete semiconductor material regions exhibiting ferromagnetic properties disposed between the lower runner portions and the upper runner portions.

47. The multi-level integrated circuit structure of claim 46 wherein the runner conductive portions and the vertical conductive portions form a helical inductor, and wherein the material layer exhibiting ferromagnetic properties comprises an inductor core.

48. An integrated circuit structure comprising:
a semiconductor substrate having an upper surface therein;
an outer winding comprising
first upper and first lower conductor layers over the upper surface;
conductive vias interconnecting the first upper and the first lower conductor layers to form a first helical structure;
an inner winding comprising
a second upper and a second lower conductor layer between the first upper and the first lower conductor layers;
conductive vias interconnecting the second upper and the second lower conductor layers to form a second helical structure within the first helical structure; and
a core comprising laterally spaced-apart discrete semiconductor material regions exhibiting ferromagnetic properties, the core within a region bounded by the second upper and the second lower runners.

* * * * *